United States Patent [19]
King et al.

[11] Patent Number: 5,812,572
[45] Date of Patent: Sep. 22, 1998

[54] INTELLIGENT FIBEROPTIC TRANSMITTERS AND METHODS OF OPERATING AND MANUFACTURING THE SAME

[75] Inventors: Jeffrey V. King, Logan; William I. Fletcher; Leon M. Lemon, both of Mendon; David D. Olsen, Providence, all of Utah

[73] Assignee: Pacific Fiberoptics, Inc., Santa Clara, Calif.

[21] Appl. No.: 674,059

[22] Filed: Jul. 1, 1996

[51] Int. Cl.$^6$ .................................................. H01S 3/00
[52] U.S. Cl. .............................. 372/38; 372/26; 372/6; 372/131
[58] Field of Search ............................... 372/38, 29, 31, 372/6, 26

[56] References Cited

U.S. PATENT DOCUMENTS

| | | | |
|---|---|---|---|
| 4,355,395 | 10/1982 | Salter et al. | 372/38 |
| 5,019,769 | 5/1991 | Levinson | 372/31 |
| 5,111,324 | 5/1992 | Jahromi | 359/189 |
| 5,286,969 | 2/1994 | Roberts | 250/214 |
| 5,307,196 | 4/1994 | Kinoshita | 359/189 |
| 5,396,059 | 3/1995 | Yeates | 250/214 |
| 5,488,621 | 1/1996 | Slawson | 372/31 |
| 5,581,387 | 12/1996 | Cahill | 359/137 |

*Primary Examiner*—Leon Scott, Jr.
*Attorney, Agent, or Firm*—Townsend and Townsend and Crew LLP

[57] ABSTRACT

Intelligent fiberoptic/laser diode transmitter/controller modules and methods of operating and manufacturing the same are disclosed. During calibration procedures for the modules, a laser diode is characterized over a defined operating temperature range. Characteristic data and/or curves defining the operational characteristics of the laser diode over the range of operating conditions (temperature, power supply) are stored in non-volatile memory such as EEPROM. During operation, an embedded microcontroller together with analog to digital converters, digital to analog converters and other associated circuitry, dynamically control the operational parameters (e.g. modulation and bias current) based on the current operating conditions (temperature, power supply). The operating conditions are used as an index into the non-volatile memory containing operational data tables as well as predicted "end-of-life" data. An automatic power control loop and data compensation scheme maintain constant optical output power over the entire operating range. The microcontroller continually updates the operating control parameters of the laser diode based on the currently sensed operating conditions. The microcontroller also continually monitors for alarm conditions such as (a) optical power-out of range (b) laser end-of-life condition. The microcontroller also gathers statistical information such as hours of operation, most extreme operating conditions, conditions at time of alarm event and number of alarm events that have occurred. Such information is stored in non-volatile memory. In addition, a serial interface to the microcontroller provides a programming and monitoring channel for pre-installation calibration and "in-the-field" monitoring and control and provides the flexibility to monitor and/or change various parameters. The serial interface provides the channel to program the device during calibration. It also provides the flexibility (if the application requires) to monitor and change parameters in operational use without taking the laser diode transmitter off-line. If desired, the optical power out of range alarm thresholds, the laser end-of-life criteria, the bias and modulation currents, the optical output power, status and control information may be dynamically monitored and/or changed without taking the laser diode transmitter off-line.

16 Claims, 15 Drawing Sheets

| Temperature | Modulation Current | Back-Facet Photo Diode Adjust | Laser End-of-Life Condition |
|---|---|---|---|
| Low Operating Temp. | DAC value for $I_{MOD}$ | Tracking Error Adjust DAC value | End-of-Life condition $I_{BIAS} / I_{TH}$ |
| ... | ... | ... | ... |
| High Operating Temp. | DAC value for $I_{MOD}$ | Tracking Error Adjust DAC value | End-of-Life condition $I_{BIAS} / I_{TH}$ |
| Statistical Information (e.g., number of hours of operation, operating condition extremes, alarm occurrences, conditions at time of alarms, serial number, model number, calibration status, etc.) | | | |
| Alarm Thresholds, Laser Disable Thresholds (i.e., high temperature laser disable) | | | |

FIG. 12

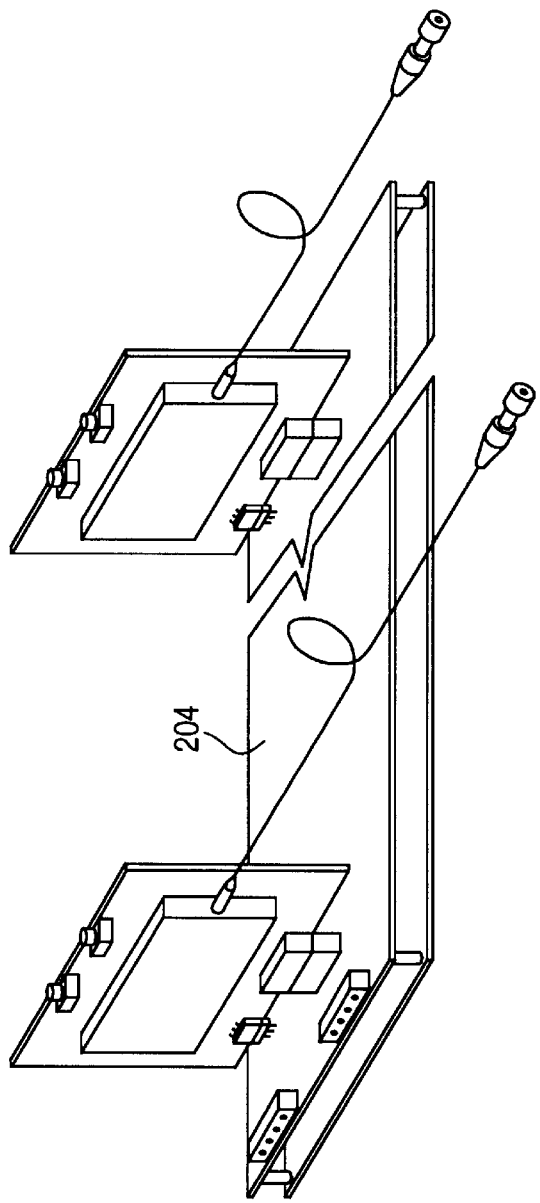
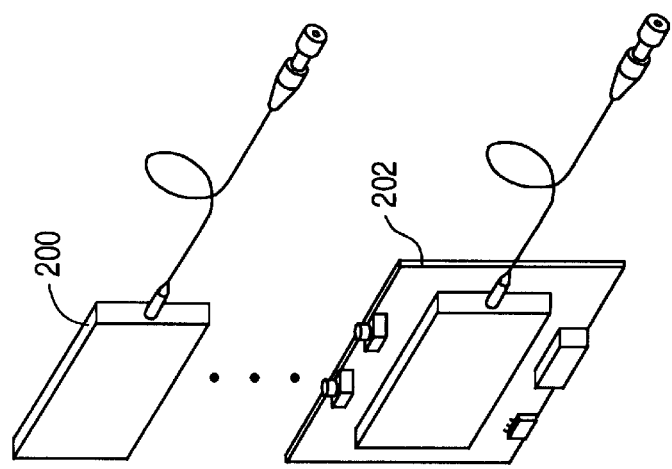
FIG. 13

INTELLIGENT FIBEROPTIC TRANSMITTERS AND METHODS OF OPERATING AND MANUFACTURING THE SAME

FIELD OF THE INVENTION

The present invention relates generally to fiberoptic transmitters employing semiconductor laser diodes, and more particularly to intelligent fiberoptic transmitters and methods of operating and manufacturing the same.

BACKGROUND OF THE INVENTION

Semiconductor laser diodes are used in a variety of fiberoptic data transmission systems for voice and data communications. FIG. 2 illustrates the light/optical output power (L) versus forward bias drive current (I) of a typical laser diode. As illustrated in FIG. 2, light/optical output power is a non-linear function of the drive current. For drive currents below a threshold current value $I_{th}$, the output power is essentially constant, and the laser diode operates in what is known as the "LED mode" of operation. For drive currents in excess of the threshold current value, the semiconductor laser diode operates in what is known as the "lasing mode" of operation.

The threshold current $I_{th}$ varies from diode to diode, and with operating temperature and age. This has resulted in difficulties in setting an appropriate operating point, or bias current, for the laser diode. Traditionally, laser diode controllers utilized a number of potentiometers, such as in analog feedback control loops, which during calibration would be painstakingly adjusted to pick a suitable operating point for the particular laser diode. In addition to being costly in terms of manufacturing time and expense, adjustment of such potentiometers is an error-prone process, which often leads to damage of the laser diode during calibration (such as due to over current) or less-than-optimum setting of the operating point of the laser diode. In general, such controllers tend to be very laborious, difficult and expensive to manufacture, and are subject to drift, error prone and less accurate over extreme temperature conditions.

Additionally, because of the temperature characteristics of typical laser diodes, such prior art controllers often are accompanied by thermoelectric coolers ("TECs") or other temperature control mechanisms, leading to additional manufacturing and operating costs, as such cooling mechanisms are prone to failure in the field.

Recently, laser diode controllers have been disclosed which attempt to avoid some of the problems presented by the potentiometer-designs of prior art controllers. An example is disclosed in U.S. Pat. No. 5,019,769. The laser diode controller disclosed in this patent utilizes a microcontroller to select an operating point based on certain data collected during calibration. Such prior art controllers, however, often must rely on thermoelectric coolers to achieve suitable operation over a wide temperature range, and in general do not provide users with the type of adaptable and intelligent control of laser diodes that increasingly demanding applications require. Additionally, such prior art controllers often attempt to select an operating point bias current for the laser diode at a certain point up the optical output power/current curve that provides a desired output power, such as one milliwatt (see, e.g., point "x" in FIG. 2). It has been determined, however, that such a method for selecting an operating point, when modulated by a data signal under actual operating conditions, can lead to current that is too high, lessening the life of the laser diode, or that is too low, leading to the laser diode operating at or below the "knee" between the laser mode and the LED mode.

In general, there is a need for more intelligent fiberoptic transmitters that can allow suitable operation over a wide temperature range with a coolerless design, while also providing adaptability and programmability and a ready method of manufacturing and calibration.

SUMMARY OF THE INVENTION

Accordingly, it is an object of the present invention to overcome problems of prior art laser diode controllers. The present invention has as an object to provide bias, modulation and automatic power control circuits, methods and algorithms for calibration, control and operation of an uncooled semiconductor laser diode over a wide temperature range. It is another object of the present invention to characterize the laser diode transmitter module at beginning of life over a specified operating temperature range. The characteristic data is then stored in the module's non-volatile memory for use throughout it's operational life. There is no required re-characterization during operation with the present invention, although in accordance with certain embodiments of the present invention the laser diode transmitter module may be re-characterized periodically, such to optimize module performance or to extend its operational life. The present invention also has as an object to provide laser diode transmitter modules that are suitable for typical telecommunications applications, which often require that optical transmission systems remain on-line and operate maintenance free for tens and hundreds of thousands of hours.

Rather than using the expensive, inefficient and traditional approach of using a thermoelectric cooler to maintain the laser diode at a relatively constant temperature, the present invention takes advantage of the fact that during calibration, the laser diode may be characterized over specified operating conditions, such as temperature and/or power supply variations, in an environmental test chamber. Therefore, rather than attempting to regulate the temperature of the laser diode, the intelligent modules of the present invention learn how the laser diode behaves in it's specified operating environment and adapt the control accordingly to maintain stable and accurate operating characteristics (such as optical output power, extinction ratio, bias current/threshold current relationship and alarm thresholds) over the specified operating conditions. The learned behavior and characteristics of the laser diode are stored in non-volatile memory (EEPROM) in the form of look-up tables and/or nth order polynomial coefficients describing a nth order curve.

The present invention uses a programmed embedded microcontroller to adjust the control parameters as a function of the continuously sensed operating environment (e.g., temperature, power supply). The present invention employs a microcontroller, digital to analog converters, analog to digital converters, temperature sensor, modulator, modulation current control and monitor, bias control and monitor, duty cycle reference for pattern compensation, tracking error adjust circuitry, optical power monitor and control circuitry, serial communications interface circuitry and other subsequently described circuits, methods and algorithms. This invention prescribes an automated, efficient, streamlined calibration and manufacturing process for a laser diode transmitter module free of time consuming, costly and error prone potentiometer adjustments and human intervention.

Accordingly, it is an object of the present invention to provide transmitter modules/transmitters that are suitable for various data and voice communication applications, including what are known as Sonet/SDH transmission systems.

It is another object of the present invention to provide transmitter modules that are adaptable to operate reliably over a wide operating temperature range, such as, for example, −40° C. to +85° C., and also over a range of power supply voltages, such as +/−5% of the nominal power supply voltage level.

It is a further object of the present invention to provide transmitter module utilizing a microcontroller and stored characteristic data for the laser diode over a range of operating conditions, with the microcontroller dynamically monitoring and adapting the operational parameters of the transmitter module as the operating conditions vary.

It is yet another object of the present invention to provide transmitter module that provides user programmability for operational parameters such as end-of-life criteria.

It is a further object of the present invention to provide transmitter modules that are adaptable to operate over a range of temperature conditions without using a cooler.

It is yet a further object of the present invention to provide transmitter modules that are capable of storing historical data, such as highest and lowest temperatures, number of hours of operation, alarm occurrences, conditions at time of alarm.

It is yet another object of the present invention to provide intelligent transmitter modules utilizing a "potless" design (i.e, no potentiometers), and simplified computer-controlled calibration, verification and testing methods used in the manufacture of such transmitter modules, and also methods of operating such transmitter modules.

BRIEF DESCRIPTION OF THE DRAWINGS

FIG. 12 illustrates a look-up table and other data stored in the non-volatile memory (EEPROM) of the laser diode controller.

FIG. 13 illustrates a single module, a single module plugged into a test/evaluation board and a backplane that houses multiple test/evaluation boards, which illustrates the flexibility of the present invention to test a few or many modules at a given time.

DETAILED DESCRIPTION OF THE PREFERRED EMBODIMENTS

Referring to the attached drawings, various preferred embodiments of the present invention will now be described.

Figure 1:
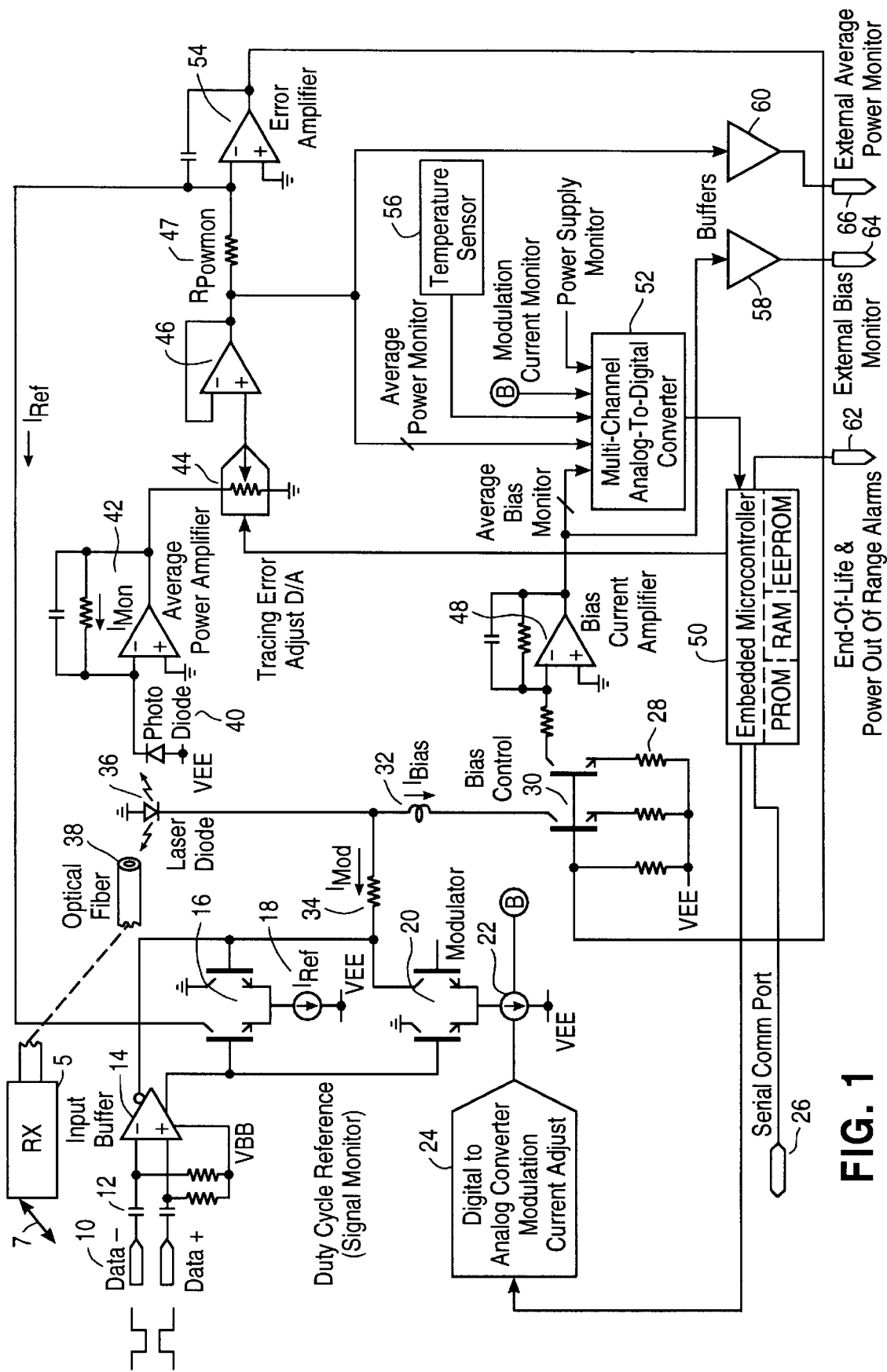
FIG. 1 is a circuit diagram of the laser diode transmitter module in accordance with the present invention.

The present invention, a preferred embodiment of which is illustrated in FIG. 1, attempts to provide optimum control of the laser diode depending upon the particular environment and operating conditions. The present invention characterizes the laser diode during calibration to create characteristic data from which the laser diode control parameters are determined during operation.

Figure 2:
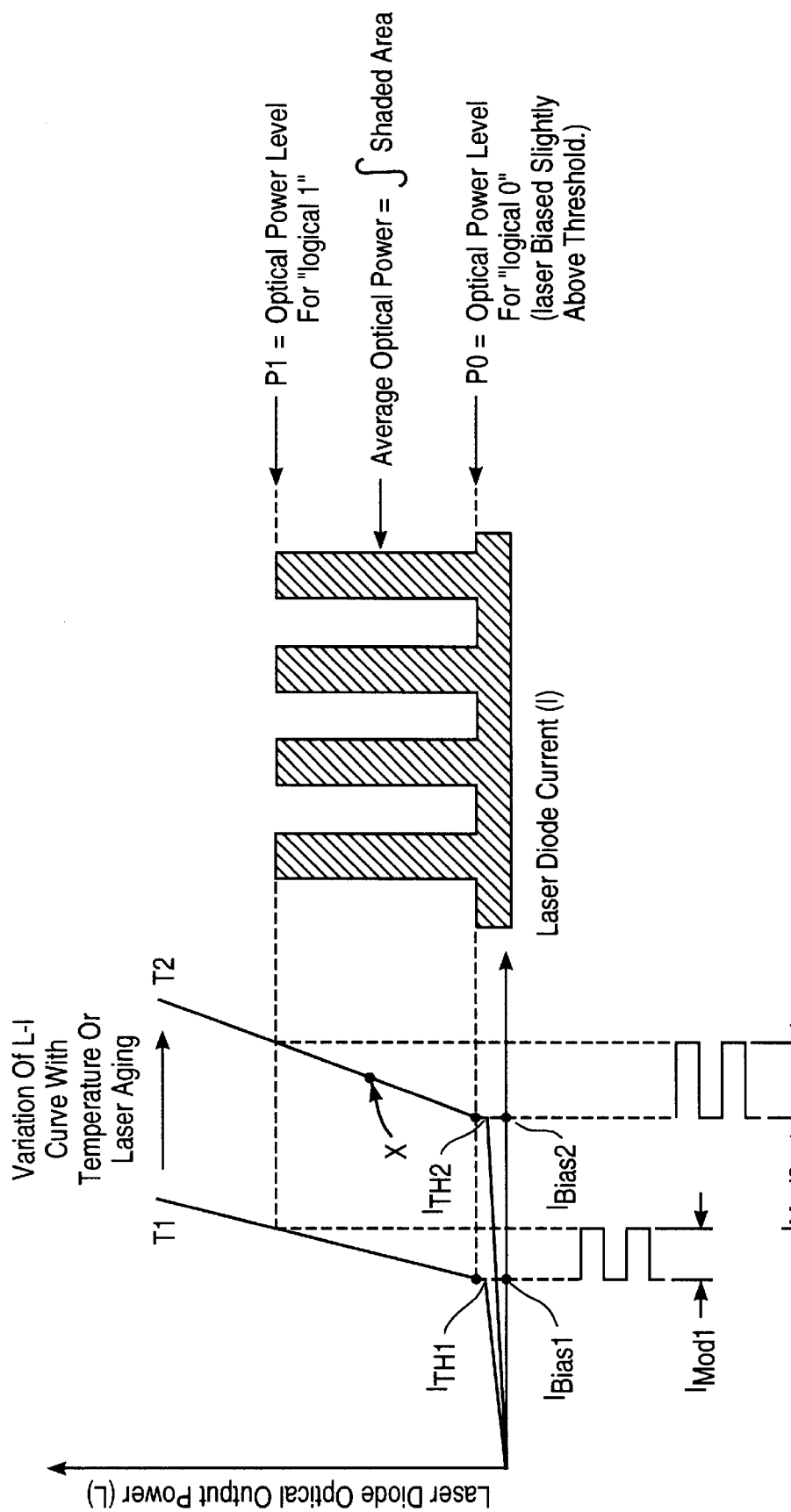
FIG. 2 illustrates laser diode optical output power (L) as a function of laser drive current (I) varying with temperature/aging.

The optical output power versus current for typical laser diodes (or the "L-I curve") is illustrated in FIG. 2, which plots the optical output power of a laser diode against laser drive current. The laser drive current as illustrated consists of two primary components, the bias current and the modulation current. In an optical fiber transmission system, the current through the laser diode is composed of the modulation current, which arises from the digital data pulse stream superimposed on the d.c. bias current. As illustrated in FIG. 2, the L-I curve changes significantly with temperature and laser aging. This characteristic of semiconductor laser diodes presents significant control difficulties as the laser diodes are applied in environments with varying temperature conditions or in environments that have long intervals between laser diode repair and replacement, etc.

In many optical transmission systems, specifically telecommunication systems, the transmission system must operate reliably and consistently over a wide temperature range. An exemplary temperature range is −40 C. to +85 degrees C. A laser diode's operating characteristics can change dramatically over such a wide operating temperature range. For example, quantum well distributed feedback ("DFB") lasers, which are sometimes utilized in long-haul telecommunication systems, will typically have a threshold current change of over 1000% over this temperature range. In addition, the slope efficiency of the laser diode will also change over such a wide operating temperature. The slope efficiency (S) of a laser diode is defined as the ratio of change in optical output power to change in laser drive current while the laser is in the lasing mode (i.e., the steep part of the curve). The laser is in the lasing mode when the laser drive current is above the threshold current. Other characteristics of the laser diode, or the back facet monitor photo diode which is commonly packaged with the laser diode (see, e.g., photo diode 40 of FIG. 1), can change significantly over temperature. It is such changing characteristics that have presented difficulties with prior art laser diode controllers.

The monitor current ($I_{MON}$), which is the current in the backface monitor of the laser diode that ideally is proportional to the power emitted from the front facet of the laser diode that is coupled to the transmission medium, will vary as a function of temperature such as due to optical alignment changes. The front facet to back facet power ratio variation creates an undesirable "front-to-rear tracking error." Variations in this parameter can cause optical power regulation circuits to operate less accurately. The front-to-rear tracking error is a function of temperature, but have been determined generally to not be a linear function, therefore making it difficult to implement front-to-rear tracking error compensation circuitry with traditional analog techniques. The present invention also seeks to characterize the laser diode/back facet monitor over temperature, which can be utilized in accordance with the present invention to determine optimum control parameters of the laser diode.

In addition, laser end-of-life criteria are usually determined by a specified increase in threshold current over time. As a laser ages, it's threshold current gradually increases. With a laser's threshold current potentially changing over 1000% over a wide operating temperature range, it is important to have the laser end-of-life criteria be a function of both the increase in threshold current as well as temperature, and in certain instances (as determined in accordance with the present invention) user programmable.

The effects of a temperature change on such a laser diode will have a significant impact on the operation of the laser diode if the operating control parameters (i.e., bias current, modulation current, front-to-rear tracking error, laser end-of-life criteria, etc.) are not adjusted for the change in temperature. For example, referring to FIG. 2, if the bias current is at $I_{BIAS1}$ and the temperature changes from T1 to T2 (or as the laser ages), the laser diode will not even be lasing at T2 if the bias current is not increased a certain amount. In addition, the laser diode is not as efficient at T2 as it is at T1 (decrease in slope efficiency), so an increase in modulation current is required to maintain the desired optical output power. Alternatively, if the laser diode has bias current $I_{BIAS2}$ and the temperature changes from T2 to T1, the laser will be operating above it's suggested power level and may burn out or age prematurely if the bias and modulation current are not decreased and regulated properly.

Because laser diodes tend to have such large swings in behavioral characteristics over temperature, many conventional laser diode controls have endeavored (or suggested) to operate the laser diode in a controlled environment to minimize the effects of temperature. As previously discussed, one approach has been to use a thermoelectric cooler ("TEC") to maintain the laser diode at a relatively constant temperature, thereby maintaining relatively constant and consistent behavior (except for the effects of aging). Such a method, however, requires more power consumption, additional control circuitry and a larger package to accommodate the TEC, which also adds another significant source of failures.

The d.c. bias point of the laser diode often is set by the user at some point on the L-I curve well above the laser threshold current so the laser diode is in the "lasing" mode of operation (see, e.g., point "x" in FIG. 2). U.S. Pat. No. 5,019,769, for example, teaches selecting a drive current level for an operating point to provide an optical output power of one milliwatt, and then modulating (i.e., in an ac manner) around that drive current level. In addition, some prior art controllers set the bias point near to but below the knee of the curve (i.e., below the threshold current). It is has been determined, however, that, while biasing slightly below the threshold current may yield a slightly improved extinction ratio, this is not desirable in high speed modulation applications. Extinction ratio is defined as the ratio of the optical power in a "logical 1" to the optical power in a "logical 0". High speed modulation schemes (several hundred megahertz and beyond) generally operate more reliably when biased above the threshold current. Laser diodes biased above the threshold current typically do not suffer from the delays associated with "going through the knee" (i.e. faster optical rise and fall times), which provide cleaner eye diagrams. Typically, there also is less dispersion and line width broadening penalties associated with high frequency modulation of lasers biased above the knee.

As more fully described below, the present invention utilizes a biasing method that endeavors to stay above the knee, but not by selecting a drive current for the laser diode to position the output power at a point up the optical output power/current curve (see, e.g., point "x" in FIG. 2) as in certain conventional controllers. Instead, and not to be limited to such preferred embodiments, the present invention in certain preferred embodiments emulates a "dc-coupled" controller for determining optimum high and low bias points, both above the knee, with a power control loop biasing the laser diode in a desired manner. The present invention may be suitably applied in digital modulation applications such as in optical telecommunication links (i.e., Sonet, SDH, ATM, etc., networks), in which it is desired to maintain maximum extinction ratio, stable optical output power, meet or exceed specified eye mask standards, provide reliable alarm indicators such as power out of range and laser end-of-life alarms.

FIG. 1 is a functional schematic of a preferred embodiment of a semiconductor laser diode transmitter module in accordance with the present invention. FIG. 1 illustrates laser diode 36 and back facet photo diode 40, which in the preferred embodiment are mounted in a common coaxial package. The light from laser diode 36 is coupled from the front facet of the laser diode into optical fiber 38. Back facet photo diode 40 is used as a monitor to determine the amount of optical power emitted into optical fiber 38. It is to be noted that, in the preferred embodiments of the present invention, operation over a wide temperature range is achieved without a thermoelectric cooler.

It is also to be noted that optical fiber 38 is coupled to or part of a fiberoptic communications channel, such as a telecommunications network, to which is coupled receiver 5. Transmitters in accordance with the present invention and receiver 5 each operate in such a telecommunications or other communications network and serve to transmit voice or data communications between points in the network. Such data is transmitted to receiver 5, which may be delivered to other communication devices or computers, etc., over port 7, which also may include control channels for operation and control of receiver 5. In certain preferred embodiments, receiver 5 is of a type described in application Ser. No. 08/673,903, filed on even date herewith and entitled "INTELLIGENT FIBEROPTIC RECEIVERS AND METHODS OF OPERATING AND MANUFACTURING THE SAME," which is hereby incorporated by reference. In such preferred embodiments, such receivers and transmitters in accordance with the present invention (as more fully described below) may be synchronously controlled, operated and maintained.

The current through laser diode 36 consists of two primary components: the bias current and the modulation current. The bias current is a d.c. current component, while the modulation current is a varying component that correlates with the incoming digital data. In a preferred embodiment of the present invention, the modulation current is implemented to emulate a "dc coupled" system, as previously described.

The modulation current is gated through laser diode 36 when digital data=1 and around laser diode 36 when digital data=0. Input buffer 14 receives either single-ended or differential input data from inputs 10 through capacitors 12, which typically are ECL level signals, which are especially useful for high speed modulation applications such as OC-12 rates and beyond. Input buffer 14 in turn drives the bases of two differential transistor pairs 20 and 16, which respectively are for the current modulation and the duty cycle reference (signal monitor). Modulator transistor pair 20 causes a current (the modulation current) to either be pulled through laser diode 36 (case of data=1) or from the system power supply (case of data=0). When the modulation current is pulled through laser diode 36, this results in an increase in optical output power (data=1). When the current is pulled from the system power supply, this results in the lack of an increase in optical output power (data=0). The amount of modulation current applied is determined during calibration (as more fully described below) and is controlled by microcontroller 50 and digital to analog converter 24. The current through modulation current path 34 in the preferred embodiment is monitored by microcontroller 50 via multi-channel analog-to-digital converter 52.

The d.c. bias current in the preferred embodiment is pulled through laser diode 36 continuously. The amount of d.c. bias current is controlled with an analog control loop (automatic power control) in conjunction with back-facet monitor photo diode 40, duty cycle reference transistor pair 16 (signal monitor) and error amplifier 54.

The preferred embodiment of the present invention implements what might be characterized as a dual loop control system. The modulation current at a given temperature is fixed, based on the slope efficiency (S) of laser diode 36 at that temperature as determined during calibration. During calibration, the slope efficiency (S) of laser diode 36 over the entire desired operating range is characterized and stored in non-volatile memory (EEPROM) of microcontroller 50. Under control of microcontroller 50, which monitors temperature through temperature sensor 56 and multi-channel analog-to-digital converter 52, the particular appropriate modulation current as determined by the stored characterization data is applied to laser diode 36. As a result, the modulation current is adjusted for temperature.

The remainder of the current applied to laser diode 36 that is required to maintain the desired average optical power is provided through bias current path 32. The automatic power control loop (described more fully below) causes the bias current to change in order to maintain a desired constant average power. During calibration, the threshold current of laser diode 36 is characterized as a function of temperature. It is then determined what amount of modulation current is required to make the bias current be at the desired operating point (e.g., at or slightly above the threshold current in the preferred embodiments) for the desired average optical power level. As laser diode 36 ages and the threshold point increases, the automatic power control loop will increase the bias current in order to maintain constant average optical power. This will allow the bias point to maintain it's original relationship with the threshold point (e.g., at or slightly above the threshold current in the preferred embodiments).

The preferred embodiment illustrated in FIG. 1 considers that slope efficiency (S) degradation is primarily a function of temperature and that no significant degradation takes place due to aging. In an alternate embodiment of the present invention, a synchronous slope detector (for example, a dither circuit) is implemented to dynamically track the threshold current. In applications where slope efficiency (S) degradation as a function of aging (not temperature) is a significant concern, this alternate embodiment of the present invention may be more suitable. It is noted, however, that accelerated aging tests on certain types of multi-quantum well distributed feedback (MQW DFB) lasers have shown little deviation in slope efficiency (S) as a function of aging.

Constant optical output power is maintained by the automatic power control loop. The loop is closed or "locked" when the current through $R_{POWMON}$ resistor 47 is equal to $I_{REF}$, the duty cycle (signal monitor) reference current. Backface monitor photo diode 40 and average power amplifier 42 sense any deviation in optical output power by a change in the monitor current $I_{MON}$. Error amplifier 54 serves to keep the loop locked and maintain constant average optical output power. As the monitor current changes due to fluctuations in optical output power, error amplifier 54 adjusts the bias current through laser diode 36 to either increase or decrease the average optical output power in order to keep the loop locked (i.e., keep the current through $R_{POWMON}=I_{REF}$), and thus maintain constant average optical output power.

Closely related to the automatic power control loop function in the present invention is the function of making the optical power loop pattern independent, that is duty cycle independent. The objective is to maintain constant optical power in a "logical 1" and constant optical power in a "logical 0." This is accomplished in the present invention with pattern compensation. A simple power control loop regulating the average optical output power is possible when the digital data stream (modulation stream) is scrambled to provide 50% mark density. Many applications, however, must be able to operate for long periods with no edges (i.e., a long succession of "logical 1s" or "logical 0s"). Pattern compensation is accomplished in preferred embodiments of the present invention by correlating the duty cycle of the incoming data pattern with the duty cycle of the optical output. Thus, the loop only acts upon power level changes and not duty cycle changes. This correlation is accomplished at the summing node of error amplifier 54 into a virtual ground. Error amplifier 54 is the primary component of the automatic power control feedback loop. When the incoming data stream is at a "logical 1" level, the duty cycle reference or "data=1 reference," pulls a fixed charge away from the summing node. When the optical output is at a "logical 1" level, the same fixed charge is dumped into the summing node, thereby serving to eliminate duty cycle dependencies from the loop.

With a duty cycle independent design as in preferred embodiments of the present invention, duty cycle changes are not seen by the bias control circuitry and power control loop. The absence of edges (i.e., a long succession of "logical 1s" or "logical 0s") on the incoming data stream will not result in continues operation of laser diode 36 at the half power point as would be the case without pattern compensation. A prolonged absence of edges on the incoming modulation stream beyond the time constant of the loop, however, will result in a bias change; that is, the loop will become unlocked and become pattern dependent. Most digital communications applications/protocols do not allow for a prolonged absence of edges in the data stream. The prolonged absence of edges can have several consequences including bias shifts in the transmitter and phase lock loss in receivers. Accordingly, in preferred embodiments of the present invention, the communication network is configured and operated so that a prolonged absence of edges (i.e., longer than the time constant of the power control loop) is not permitted.

In general, it has been determined that, with a communications or network protocol that permits an edge-free period of $T_1$ seconds, the time constant of the power control loop should be a minimum of 10–100×$T_1$ seconds, and in some applications as much as 1000×$T_1$ seconds. With the dual loop structure of the present invention, the loop time constant is thus preferentially chosen based on the particular specification of the application communications and/or network protocol.

During manufacturing, the resistor of average power amplifier 42 through which $I_{MON}$ passes is determined. This resistor is part of average power amplifier 42 and is instrumental in setting the peak power level ($P_1$). This resistor value is determined as a function of several parameters: (a) typical tracking ratio (back-facet monitor photocurrent $I_{MON}$ per unit of optical output power); (b) the desired peak power level ($P_{PEAK}$); and (c) the desired operating voltage on the input (high) side of tracking error adjust DAC 44.

An optimal operating voltage is determined for the input (high side) of the tracking error adjust DAC 44. This operating voltage is determined based on the design and operating criteria of tracking error adjust DAC 44, which serves as a variable attenuator to compensate for tracking error of back-facet photo diode 40 over the operating temperature range. The operating voltage would nominally be chosen at a mid-point around which tracking error adjust DAC 44 may swing. The resistor of average power amplifier 42 is determined by the following equation:

R (ohms)=operating voltage (volts)/(tracking ratio (amps/milliwatt)×$P_{PEAK}$ (milliwatts));

Tracking error adjust DAC 44 is used to maintain stable or flat optical output power over the desired temperature range by, in essence, canceling the effects of the back facet tracking error. As the tracking ratio changes due to temperature variations, tracking error adjust DAC 44 is updated under control of microcontroller 50 to compensate for the change in tracking ratio.

Without being bound by theory or any specific example provided herein, the following may be considered. At 25 degrees C., the tracking ratio may be 250 microamps/milliwatt; that is 250 microamps of back facet monitor current for 1 milliwatt of front facet optical output power from laser diode 36. At 50 degrees C., however the tracking ratio may be increased to 275 microamps/milliwatt. In this example, tracking error adjust DAC 44 would be adjusted under control of microcontroller 50 such that this increased current would flow through a smaller resistance (i.e., a variable attenuator function of tracking error DAC 44) in order to maintain the same voltage and hence the same current through $R_{POWMON}$ to keep the loop locked (i.e., loop locked when current through $R_{POWMON}=I_{REF}$). During calibration, the tracking ratio over the entire desired operating temperature range is characterized. This information is stored in non-volatile EEPROM of microcontroller 50 and is accessed during operation to update tracking error adjust DAC 44 to cancel such temperature dependent tracking errors, thereby furthering the abilities of laser diode control modules to provide and monitor optimum bias and modulation current to laser diode 36.

The preferred embodiments of the present invention characterize constituent components over a range of operating parameters during calibration of the transmitter modules.

Figure 3:
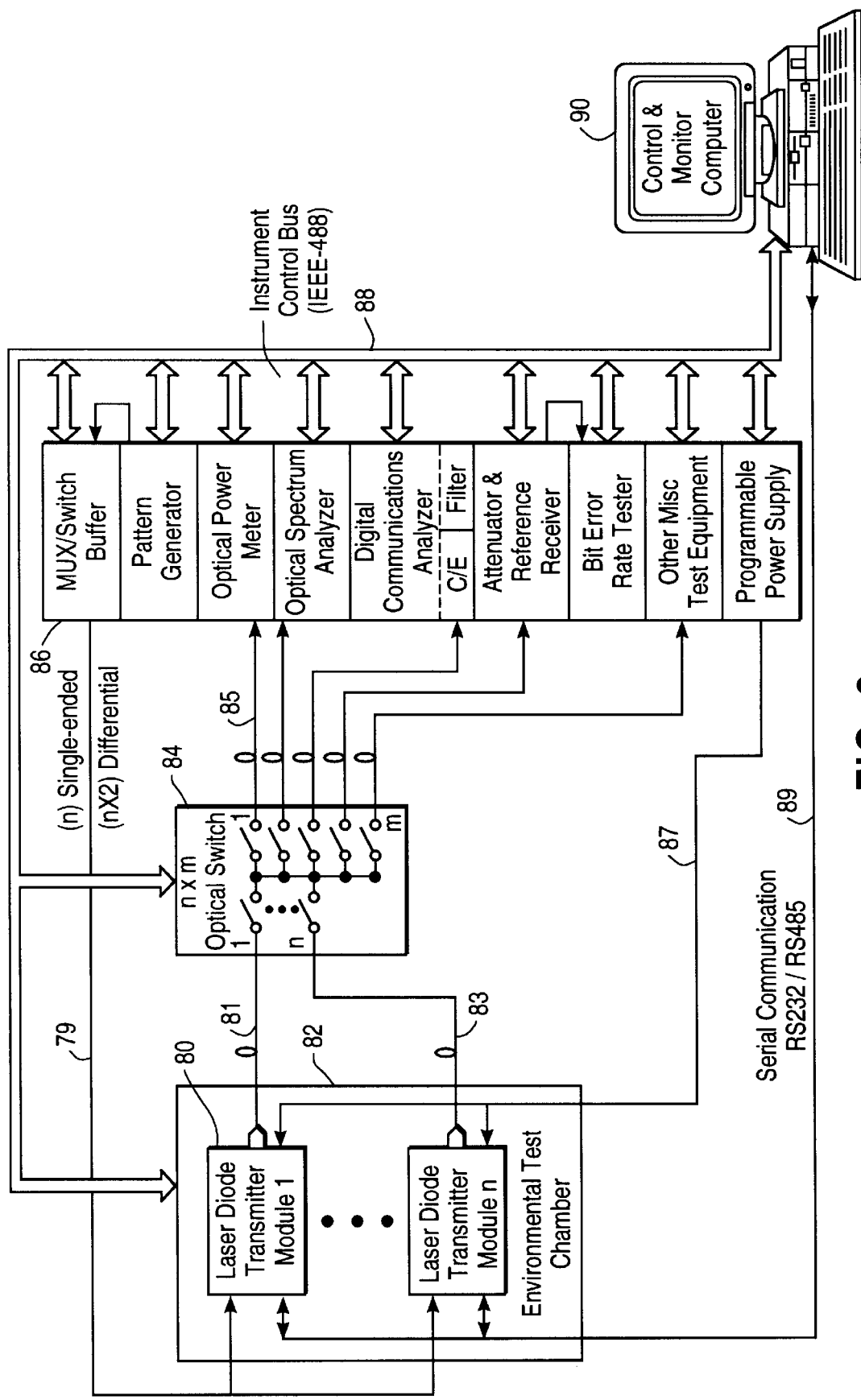
FIG. 3 illustrates the setup and connectivity used to characterize and calibrate multiple laser diode transmitter modules.

FIG. 3 illustrates a setup used to characterize and calibrate laser diode transmitter modules in a production environment in accordance with preferred embodiments of the present invention.

Modules 80 are housed in environmental chamber 82 to provide power and a communications interface with calibration control unit 86. Multiple backplanes may be interconnected in environmental chamber 82 to provide a calibration environment for hundreds of modules at a time in certain high volume production environments. RS-485 communication interface 89 links the microcontroller of each module (e.g., microcontroller 50 of FIG. 1) to an external monitor/control system such as a desktop or portable personal computer, illustrated as computer 90 in FIG. 3. An RS-232 to RS-485 converter is provided to enable multipoint communications in which one computer can control and monitor multiple modules 80. During calibration, modules 80 are placed in environmental test chamber 82 where the operating conditions (i.e., temperature) can be controlled. Central computer 90 controls all instruments of calibration control unit 86 and test chamber 82 via instrument control bus 88, which in the preferred embodiment is an HP-IB (IEEE-488) bus. All of the test equipment illustrated in calibration control unit 86 (e.g., mux/switch buffers, pattern generator, optical power meter, optical spectrum analyzer, digital communications analyzer, [optical/electrical converter and filter, attenuator and reference receiver, bit error rate tester, other test equipment and programmable power supply, etc.) is not needed for calibration of modules 80, but such equipment may be used in other embodiments for other verification and testing purposes.

Figure 4:
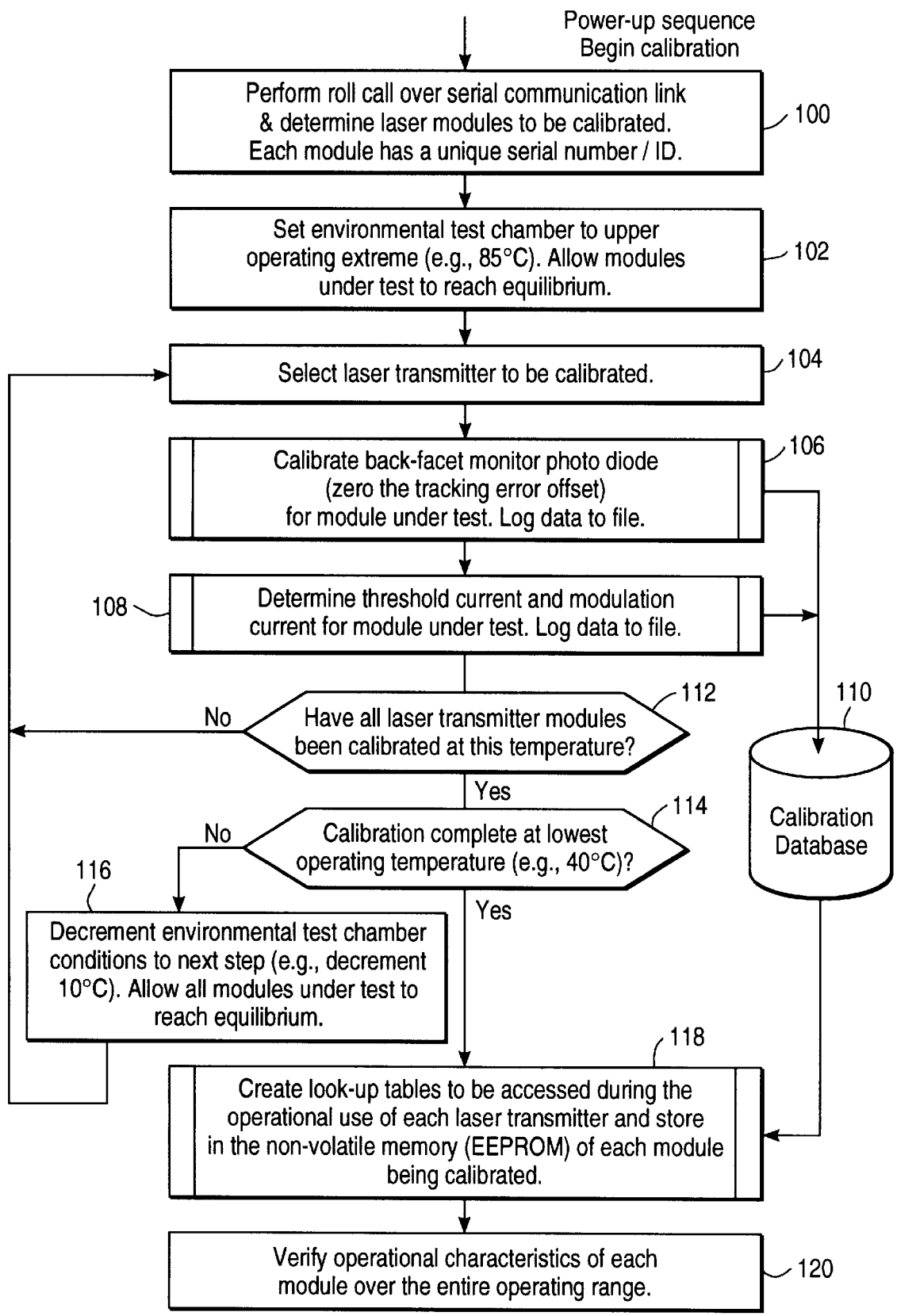
FIG. 4 is a top level process flow chart of the laser diode module calibration process.

FIG. 4 is a top level flow chart of a calibration process for laser diode control/transmitter modules 80 in accordance with preferred embodiments of the present invention. As the calibration sequence begins, a roll call is performed at step 100 over RS-485 bus 89. At this time, control computer 90 identifies all modules 80 present in environmental chamber 82 by module type and serial number. If a particular one of modules 80 is already calibrated, the software is configurable to either prompt the user to re-calibrate or proceed without prompts. A location in the EEPROM of each of modules 80 (i.e., in microcontroller 50 of FIG. 1) flags the module as a calibrated or non-calibrated module. Other module-specific data is stored in EEPROM as well; such as serial number, module type, calibration date, etc.

After the roll call of step 100, the software in control computer 90 sets environmental test chamber 82, for example, to the upper operating extreme of temperature (e.g., 85 degrees C.) via instrument control bus 88 at step 102. In preferred embodiments, control computer 90 monitors the temperature in environmental chamber 82 as well as the temperature of each individual module. After modules 80 have reached equilibrium at the target temperature, the calibration process begins by selection of a module to be calibrated at step 104.

Figure 5:
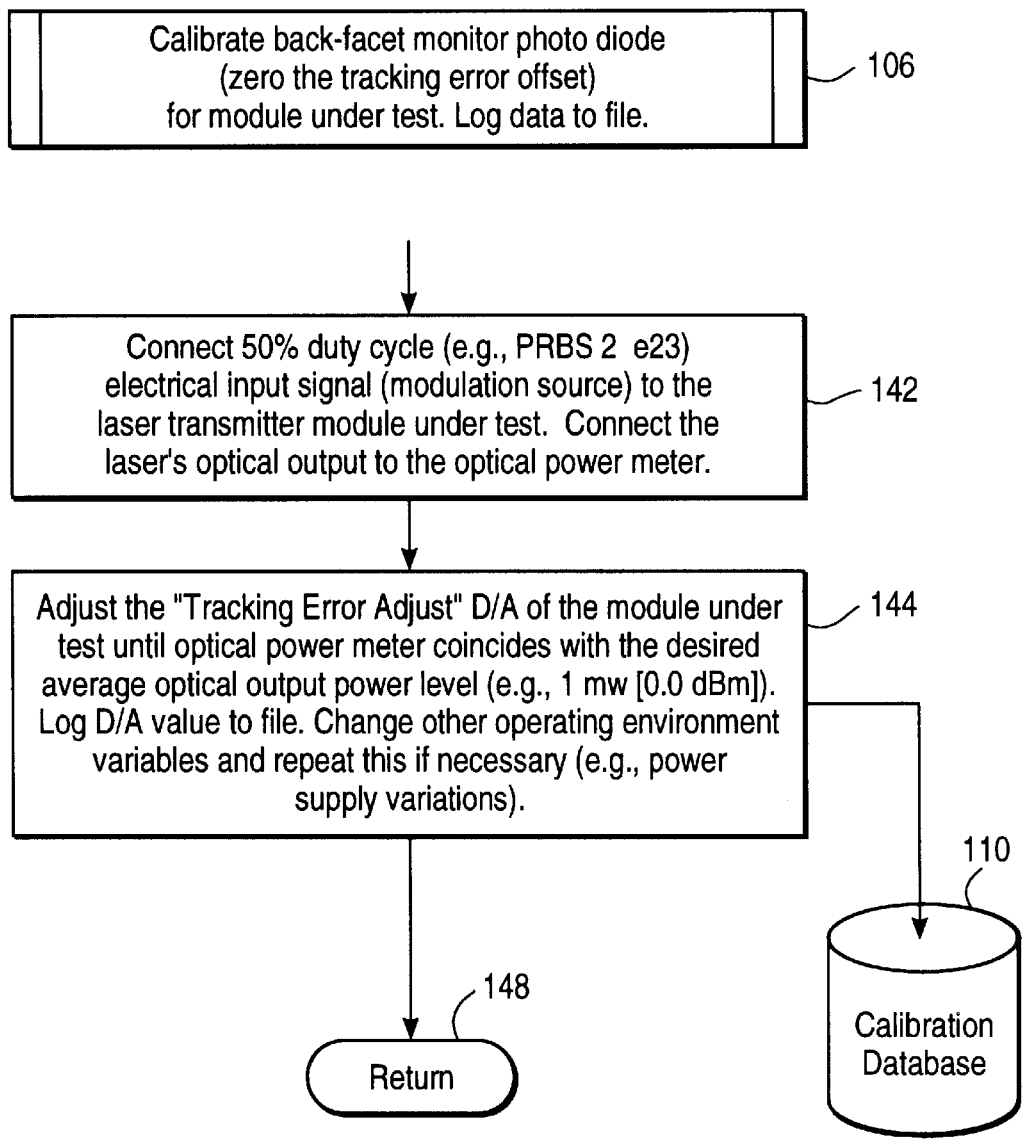
FIG. 5 is a flow chart of the process of calibrating the back facet monitor photo diode, which is useful for zeroing the tracking error.

First the back facet monitor of each module is characterized and the module calibrated at the target temperature. FIG. 5 illustrates the process flow for characterizing and calibrating the back facet monitor (see, e.g., back facet photo diode 40 of FIG. 1) at step 106. The modulation data stream, an example being the PRBS $2^{23}1$ ECL pattern, is switched at step 142 via software control over instrument control bus 88 to the particular one of modules 80 that is to be calibrated. The optical power output of the particular module is switched via optical switch 84 to an instrument in calibration control unit 86 that can measure optical power (e.g., optical power meter, digital communications analyzer, etc.). Tracking error adjust DAC 44 is adjusted at step 144 until the optical power reading indicates that the optical output power is at the desired power level (in preferred embodiments, the optical insertion loss of the optical switch and associated fibers is calibrated at startup). As tracking error adjust DAC 44 is adjusted to decrease the impedance (as discussed previously, tracking error adjust DAC 44 is essentially a variable attenuator), an increased current (hence a higher optical output power) must flow to keep the power control loop locked. As tracking error adjust DAC 44 is adjusted to increase the impedance, a decreased current (hence a lower optical output power) must flow to keep the power control loop closed. This calibration process serves to null out the effect of tracking error of the back facet monitor, and improves the performance of modules in accordance with the present invention. The value of tracking error adjust DAC 44 is logged to calibration database 110 for the given module at the target temperature at step 144. After step 144, the process returns (step 148) to the calibration process flow illustrated in FIG. 4.

Figure 6:
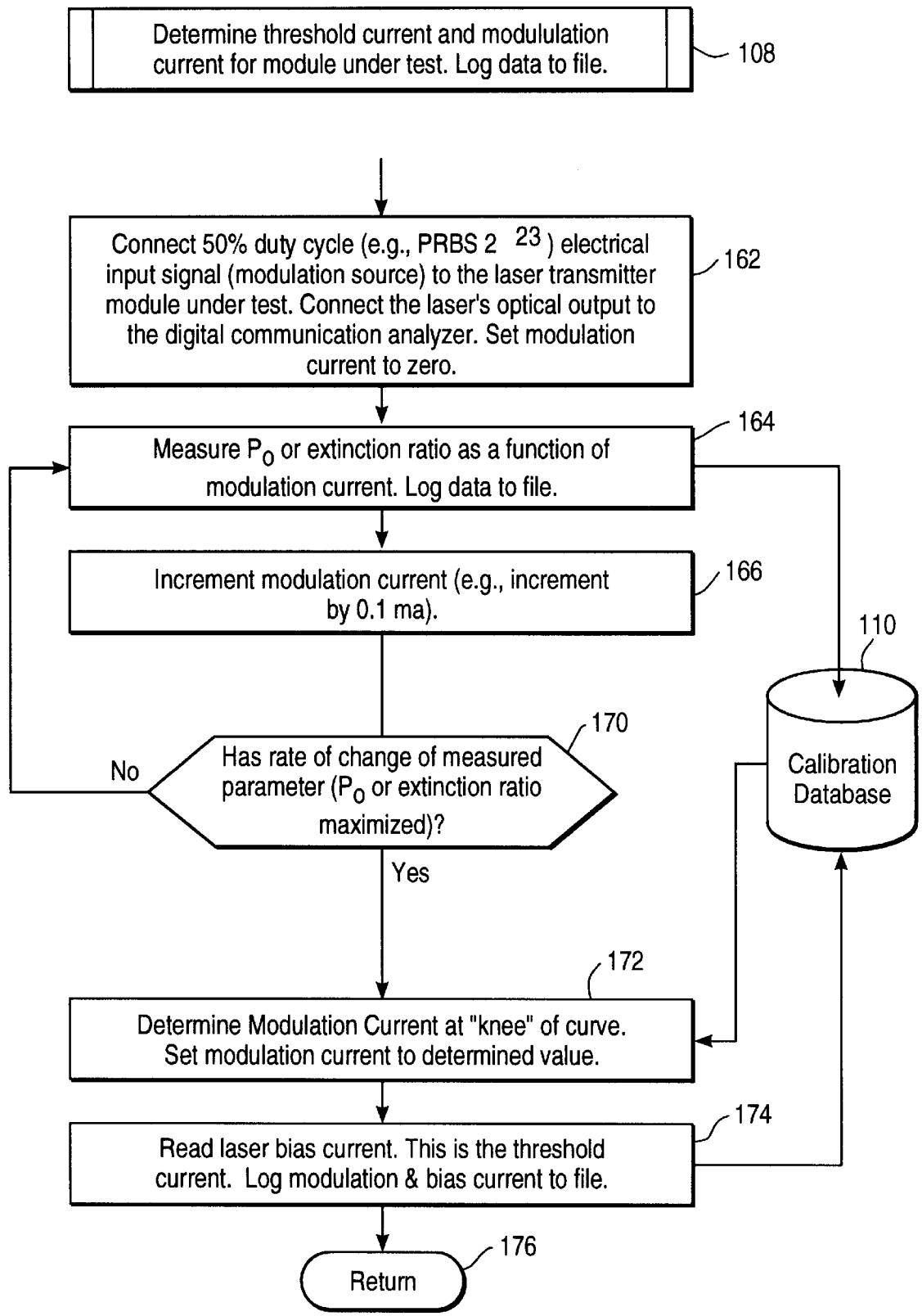
FIG. 6 is a flow chart of the process used during calibration to determine the threshold and modulation currents.
Figure 7:
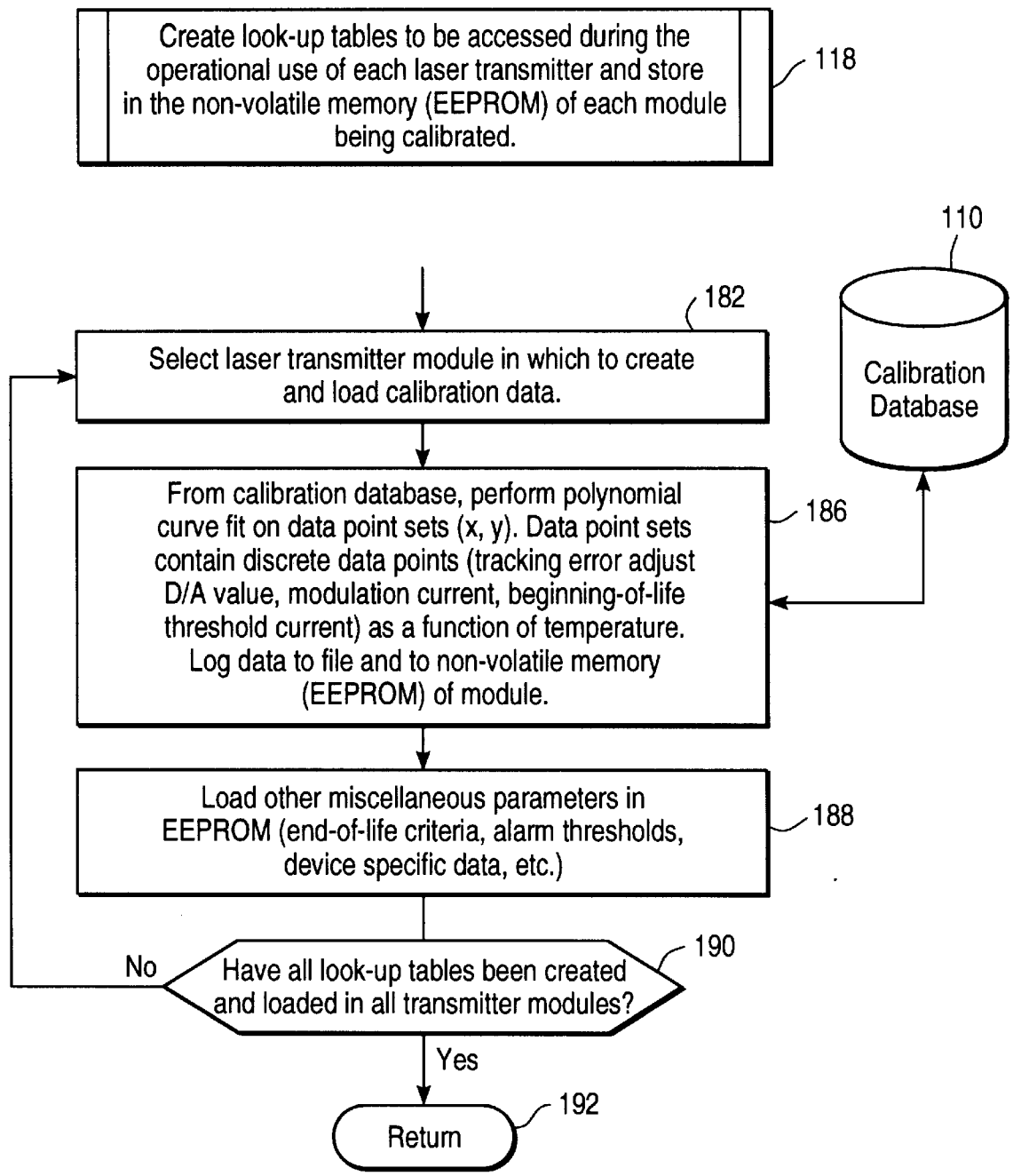
FIG. 7 is a flow chart of the process used to create look-up tables stored in the laser transmitter module's non-volatile memory (EEPROM).

At step 108, the threshold current and the modulation current for the particular module under test at the target temperature are determined. FIG. 6 illustrates the process flow for the threshold and modulation current determination of step 108. At this point, the modulation stream is still connected to the module under calibration. If not already connected, the optical output of laser diode 36 is connected via optical switch 84 (controlled via instrument control bus 88) to a digital communications analyzer (via an O/E converter) in calibration control unit 86. In certain embodiments, the digital communication analyzer has an optical to electrical (O/E) converter and optional filters integrated into the instrument. This instrument can measure parameters such as extinction ratio and power levels associated with a "logical 0" or "logical 1," among other parameters.

The modulation current initially is set to zero. Since the modulation current is zero, the automatic power control loop will cause all current to flow through the bias path in order to maintain the desired optical output power level (as calibrated in the previous step). Several parameters (e.g., $P_0$, extinction ratio) may be measured in the determination of the threshold current, but in the preferred embodiment, and for purposes of discussion, it is assumed that the $P_0$ level (modulation current=0) is measured. That is, the power level associated with a "logical 0" is discussed for this preferred embodiment, but in other embodiments the extinction ratio and/or other parameters may be measured.

The $P_0$ level is measured over instrument control bus 88 and the value stored in calibration database 110. The modulation current is then incrementally increased and the $P_0$ level measured again. This process continues until the $P_0$ level deviation becomes small, indicating that the laser is biased under the knee (threshold). After this process is complete, the data, as graphically illustrated in FIG. 8, is stored in calibration data base 110 for the laser diode/module 80 under calibration.

Figure 8:
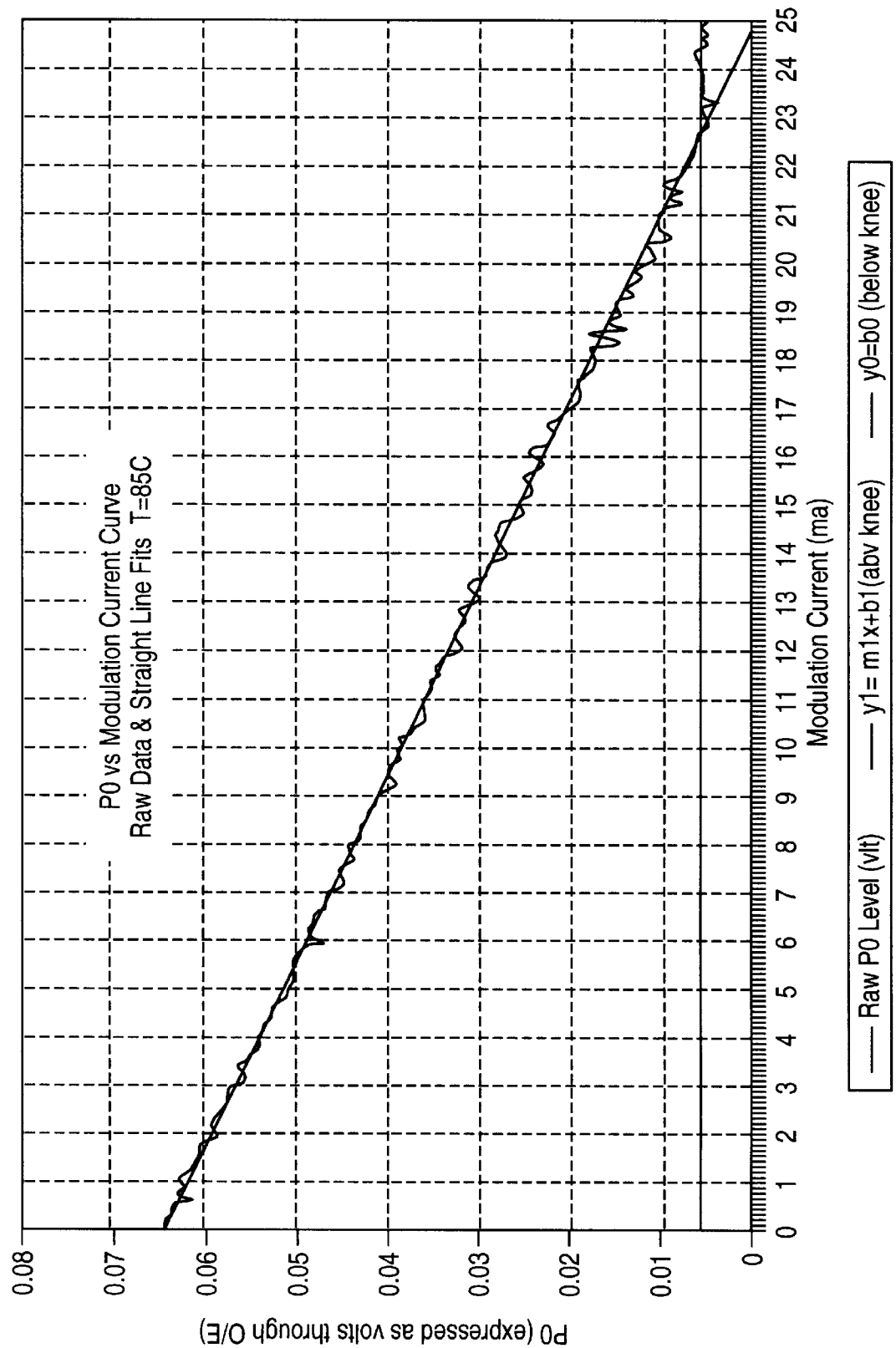
FIG. 8 graphically illustrates data and methodology used in determining modulation and threshold current. This is a plot of $P_0$ vs modulation current for a given laser at 85 C., where $P_0$ is the optical power level in a "logical 0."

As an example for purposes of discussion, FIG. 8 is a plot of $P_0$ vs modulation current for a laser at 85 degrees C. When the $P_0$ level deviation becomes small (i.e., measured $P_0$ values become relatively flat), this indicates that the laser bias point has moved under the knee, or the threshold current point. The threshold current can be determined using one of several methods, all of which may be used advantageously in accordance with the present invention (see, e.g., Bellcore Technical Advisory TA-NWT-000983, which is hereby incorporated by reference). Three different methods for determining threshold are the "Two-Segment Fit," "First Derivative" and "Second Derivative." In other embodiments, other methods are utilized. While any such method may be utilized, it has been determined that the two-segment fit method is less sensitive to noise and may be readily applied in the present invention, while the derivative methods tend to accentuate noise that may be present in the data.

FIG. 8 illustrates the two segment fit method. As illustrated in FIG. 8, two straight lines have been fitted to the data, one to the linear portion below the knee of the curve, and one to the linear portion above the knee of the curve. In the preferred embodiment, a least squares linear regression is used to calculate the slope coefficient (m) and the offset coefficient (b). The calculated slope and offset represent the best trend line which can be fitted through the data. The coefficients are calculated using an algorithm which minimizes the sum of the squares of the vertical deviations separating the trend line from the actual data points. As may be observed in FIG. 8, the trend line through the data above the knee (y1=m1x+b1) is a very good fit to the actual data. The trend line for the data below the knee of the curve has been approximated to the form of a straight line (y0=b0, slope m0=0). The point where these two lines intersect determines the modulation current required to cause the automatic power control loop to bias the laser at the threshold current.

The modulation current (which is the x variable in this case) where the intersection of these lines occur is determined by setting b0=m1x+b1 and solving for x.

Modulation Current (x variable)=(b0−b1)/m1

Once the modulation current is determined that causes the automatic power control loop to bias the laser at the threshold current, the threshold current is readily obtained by reading the average bias monitor input of multi-channel analog to digital converter 52. For example, in FIG. 8 it was determined that a modulation current of 22.5 milliamps would cause laser diode 36 to be biased at the threshold current point for the given laser at 85 degrees C. Modulation DAC 24 was loaded with the value corresponding to 22.5 milliamps. The bias current was then read from multi-channel analog to digital converter 52 and it was determined that the threshold current at 85 degrees C. was 27.9 milliamps. This data is then stored in calibration database 110.

Referring again to FIG. 4, at step 112 of the calibration, the previously described calibration steps are repeated until all other modules 80 to be tested are calibrated at the target temperature. Once all other modules have been calibrated at the target temperature, at step 114 a determination is made of whether all modules have been calibrated at all temperature points of the desired temperature range. If not, then at step 116 the temperature of environmental chamber 82 is decremented by, for example, 10 degrees C. (and stabilized), and the process is repeated at the new temperature. This process continues until all modules have been calibrated at determined temperature points over the entire operating temperature range. After all the raw data has been collected in calibration in data base 110, several data arrays exist from which operational parameters of the laser diode may be calculated.

The data arrays in calibration data base 110 may be pictured as three sets of (x, y) pairs: (x, y1), (x, y2), (x, y3). If, for example, there were 10 different temperature settings during calibration, there would be 10 (x, y) pairs in each array. In these arrays, x represents temperature, y1 represents modulation current, y2 represents tracking error adjust DAC value and y3 represents laser threshold current. In other words, there are discrete data points over the operating temperature range that describe modulation current, tracking error and beginning-of-life threshold current as a function of temperature.

Using these discrete data points, functions y=f(x) are defined that very closely match the actual data. These functions may then be used to solve or interpolate, etc., for temperature values that were not part of the raw measured data. Polynomials are generally used as approximating functions because of their simplicity and speed of calculation, and such polynomials are used in preferred embodiments of the present invention. A polynomial curve fit is used to determine the approximated functions y=f(x). Polynomial curve fitting results in a single polynomial equation of order N which is the least squares approximation of the original data. Polynomial curve fitting is actually a case of least squares multiple regression. A polynomial equation will be of the form $$y = c_0 + c_1 x^1 + c_2 x^2 + c_3 x^3 + \ldots c_n x^n$$

Figure 9:
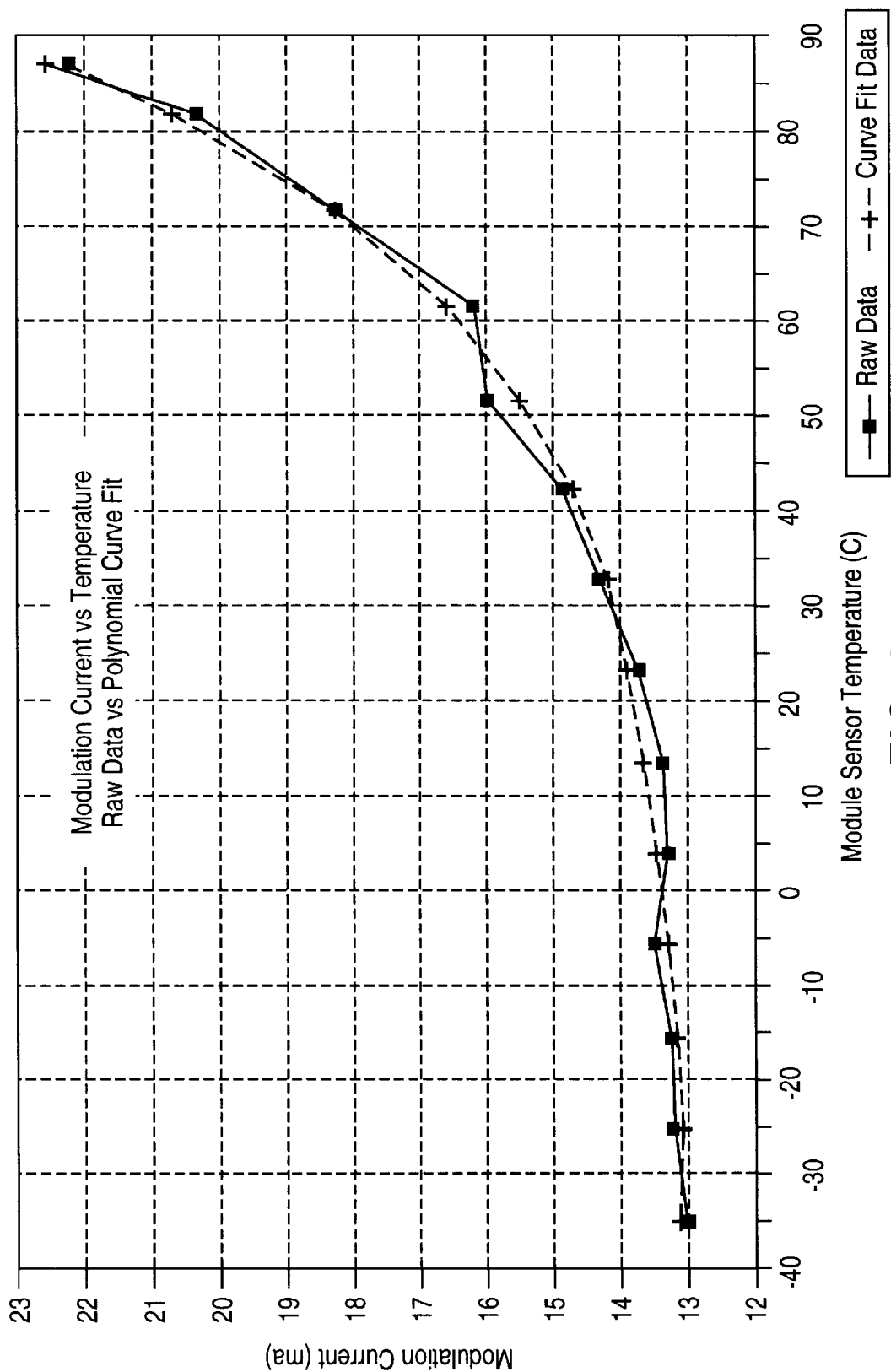
FIG. 9 illustrates discrete measured modulation current values vs temperature and also shows the polynomial curve fitted through these data points.
Figure 10:
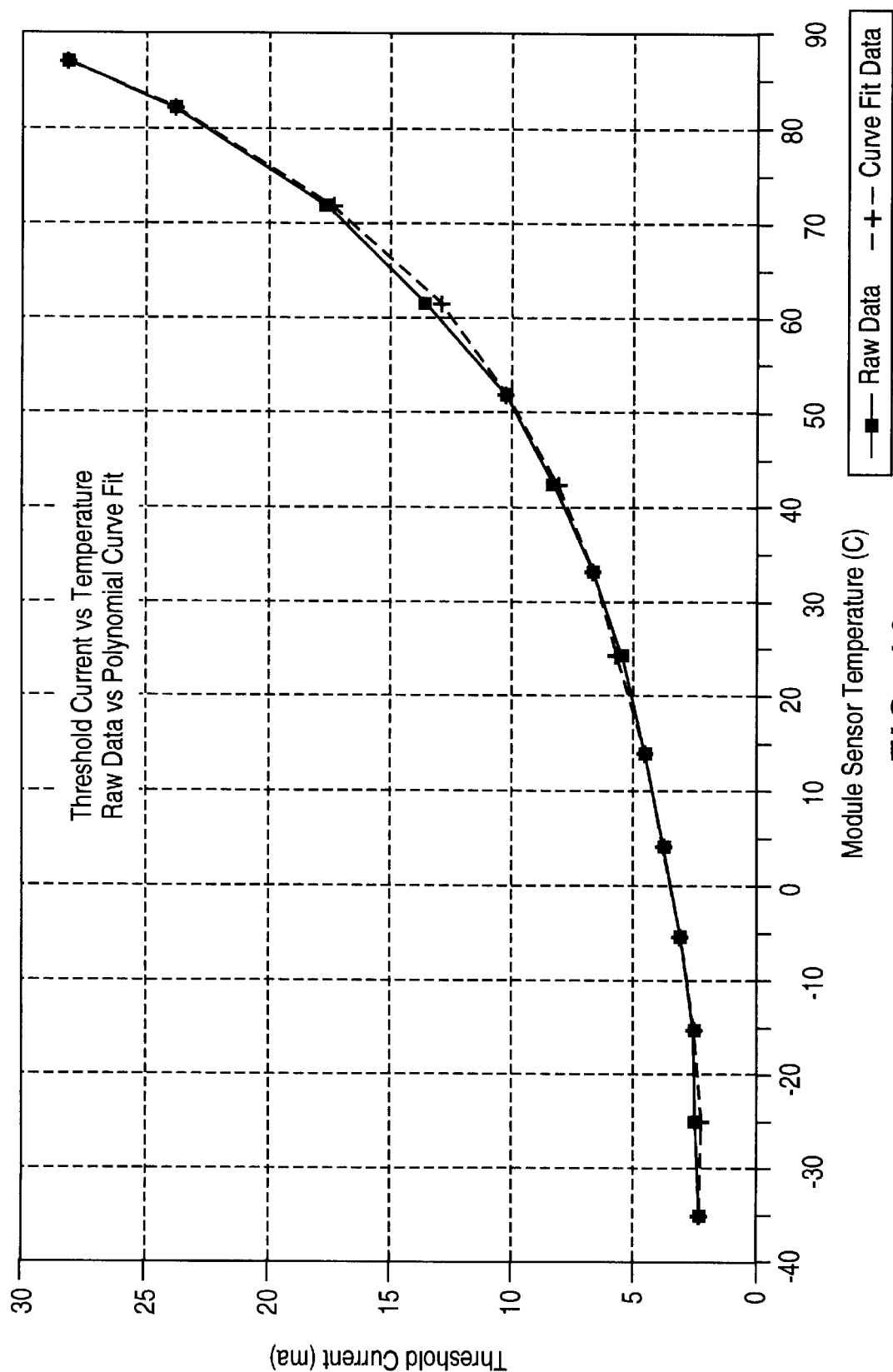
FIG. 10 illustrates discrete measured threshold current values vs temperature and also shows the polynomial curve fitted through these data points.
Figure 11:
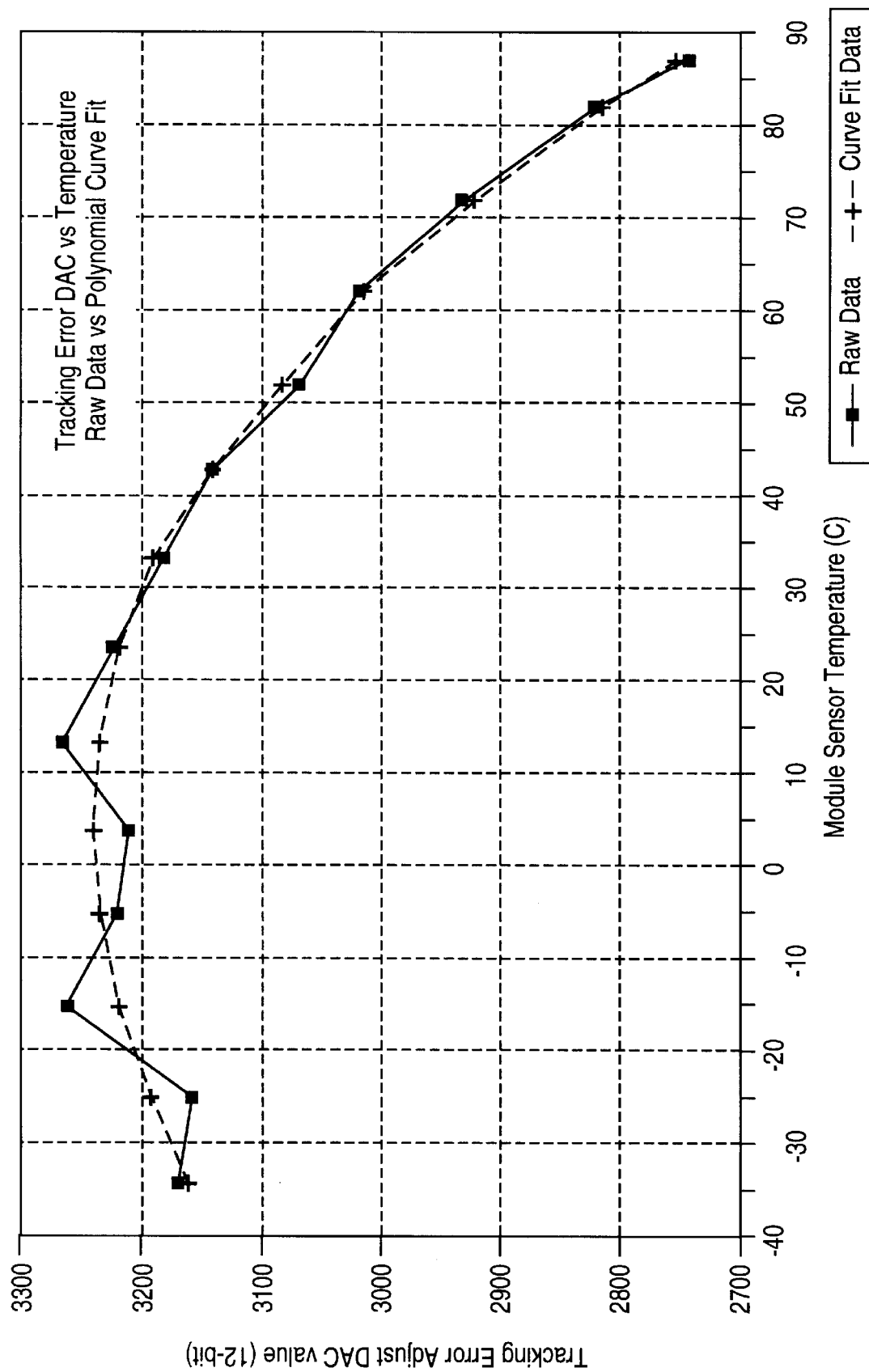
FIG. 11 illustrates discrete measured tracking error adjust DAC values (12-bit values) vs temperature and also shows the polynomial curve fitted through these data points.

FIG. 9 illustrates a plot of 14 discrete modulation current values against the estimated values calculated using a polynomial curve fit. FIG. 10 illustrates a plot of 14 discrete threshold current values against the estimated values using a polynomial curve fit. FIG. 11 illustrates a plot of 14 discrete tracking error adjust DAC values (12-bit values) against the estimated values using a polynomial curve fit. As may be observed from the plots, the polynomial fit data closely matches the actual data.

The quality of the polynomial fit may be monitored with access to plots as those previously described, as well as by monitoring parameters of the curve fitting algorithm such as the correlation coefficient (R), the coefficient of determination ($R^2$) and the standard error of the estimate (SEE). The closer the correlation coefficient and the coefficient of correlation are to 1, the better the fit. The standard error estimate is a measure of the scatter of the actual data about the fitted line. The smaller the SEE, the closer the actual data is to the theoretical polynomial equation. In the preferred embodiment, such parameters are computed, and if any fall outside a predetermined window or range, a warning flag is set.

In alternative embodiments, the laser diode is characterized, including over the desired temperature conditions, etc., either by the manufacturer or by another party in a separate calibration/test facility, with such data loaded via, for example, serial port 26 in non-volatile memory. In yet other alternative embodiments, the circuit of FIG. 1 is altered so that the bias control loop may be "opened" during calibration and the bias current controllably stepped through a range of currents, so that the optical output at various currents may be measured and the threshold current, slope efficiency, etc., may be determined, with, after processing as appropriate, operational parameters subsequently stored in non-volatile memory. Such alternative embodiments are within the scope of the present invention.

At this point in the calibration process, the nonvolatile memory (EEPROM) of microcontroller 50 is loaded with the module (laser diode 36) characteristic data. This data can either be loaded in the form of a table with pre-computed discrete values associated with a given temperature or with polynomial coefficients, which microcontroller 50 uses to compute the values in real time. FIG. 12 illustrates a table of discrete values for an exemplary memory map in microcontroller 50 that is utilized in preferred embodiments of the present invention. Each entry in the table indicates the values to be used for the corresponding temperature. Each line entry in the table represents an incremental change in temperature. The temperature step per table entry can be as large or small as desired and is only limited by the available memory in microcontroller 50. One array in the table holds the values to be loaded in modulation current adjust DAC 24 for the corresponding temperature. Another array stores the values to be loaded in tracking error adjust DAC 44 for the corresponding temperature. Yet another array stores the laser end-of-life bias value for the corresponding temperature.

The laser end-of-life bias value is computed based on the laser beginning-of-life threshold current. As discussed earlier, a curve describing the beginning-of-life threshold current as a function of temperature has been established. The laser end-of-life condition may be a function of the beginning-of-life threshold curve. For example, lasers that have a beginning-of-life threshold current of less than 10 milliamps in certain embodiments are characterized as "at end-of-life" when the bias current (assuming during calibration that the laser is biased at threshold) exceeds beginning-of-life threshold +10 milliamps. In such embodiments, lasers that have a beginning-of-life threshold greater than 10 milliamps are characterized as "at end-of-life" when the bias current exceeds beginning-of-life threshold×1.5. Other criteria based on initial laser characteristic data are applied in other embodiments of the present invention. With the present invention, using a microcontroller and non-volatile memory (such as EEPROM), such parameters are easily programmed or changed. If the application requires the laser diode to be biased above or below threshold, this may easily be factored into the end-of-life criteria data. During calibration the bias/threshold relationship is established, so any end-of-life criteria as a function of change in threshold current may easily be established.

Characterizing the curves in the form of stored polynomial coefficients is utilized in alternative embodiments. Such a method typically would require less non-volatile memory storage but would require more real-time microcontroller processing abilities. In such alternative embodiments, real-time updating of all parameters is provided even for slight temperature changes, whereas the table method has a temperature step resolution limited by the table size and the temperature range covered.

In the preferred embodiments, after characteristic data has been loaded in the EEPROM of microcontroller 50, other module specific parameters are loaded in the EEPROM. Such parameters may include power out of range alarm thresholds (both high and low), laser disable temperature thresholds, statistical information, etc. The calibration sequence is complete when all modules have been characterized, with their characteristic data or "signature" loaded in their respective non-volatile memories.

After calibration, the modules are tested and verified against applicable specifications. FIG. 3 illustrates a setup used in preferred embodiments that allows various tests and verification procedures to be run in an expeditious and automated fashion. The embodiment illustrated in FIG. 3 provides the primary components of a test and verification station that may provide rigorous test and verification capabilities for a large number of modules in accordance with the present invention. In other embodiments, a multi-channel A/D card is provided in monitor computer 90 that may be used to monitor the analog and digital outputs (pins) of each module (i.e. alarm signals, bias and power monitor pins). Such functionality is designed into the backplane card that houses the multiple modules in other embodiments.

Referring now to FIG. 13, further details will be explained regarding how a system in accordance with the present invention greatly facilitates the calibration, verification and testing of multiple modules. A test/evaluation board is provided with the present invention for stand-alone module calibration, verification and testing. For users who want to test, operate or evaluate a single module 200, test/evaluation board 202 is provided. Test/evaluation board 202 has a power supply connector, a communication interface connector (RS-485), a signal monitor connector (access to alarm and monitor pins) and two differential data input connectors (SMA) (reference also may be made to FIG. 3 for exemplary details thereof). Test/evaluation board 202 may readily be used in a benchtop environment to test/evaluate a single module. In preferred embodiments of the present invention, backplane 204 is provided to accommodate multiple test/evaluation boards 202. With the use of backplane 204, multiple test/evaluation boards 202 are vertically mounted, and hence multiple modules 200 are readily accommodated. The same connector interfaces used in the stand alone test/evaluation board are used in the preferred embodiments to interface test/evaluation boards 202 to backplane 204. Backplane 204 has an intelligent interface to gate communications to specific modules in accordance with a defined serial communications protocol. Control and monitor computer 90 connects to backplanes 204 for RS-485 serial communications. Each of backplanes 204 has a configurable backplane address and multiple slot addresses. The RS-485 bus is daisy chained among multiple backplanes 204 to provide a communication interface to a large number of modules. Backplanes 204 also may be provided in an environmental chamber for calibration, verification and testing purposes, as previously described.

In accordance with the present invention, a large number of modules may be quickly calibrated, tested and verified over a wide temperature range in an environmental test chamber. With the present invention, automated measurement is facilitated of various optical and electrical parameters such as extinction ratio, optical rise and fall times, eye mask conformance, overshoot and undershoot, frequency response, optical power, consecutive identical digit immunity, associated receiver sensitivity and response, center spectral wavelength, spectral width, side mode suppression ratio and other optical and electrical parameters. In addition to the above mentioned parameters measured with instruments included in calibration control unit 86, individual module characteristics and data may be controlled and monitored via the RS-485 communication interface. This includes parameters such as serial number, number of hours of operation, bias current, modulation current, tracking error adjust factors, calibration data, alarm status, alarm thresholds, etc.

In the preferred embodiment a Motorola 68HC705 microcontroller is utilized as microcontroller 50, although in other embodiments other microcontrollers are utilized. In certain embodiments, a microcontroller with integrated A/D functions are utilized to provide a more integrated solution.

Figure 14:
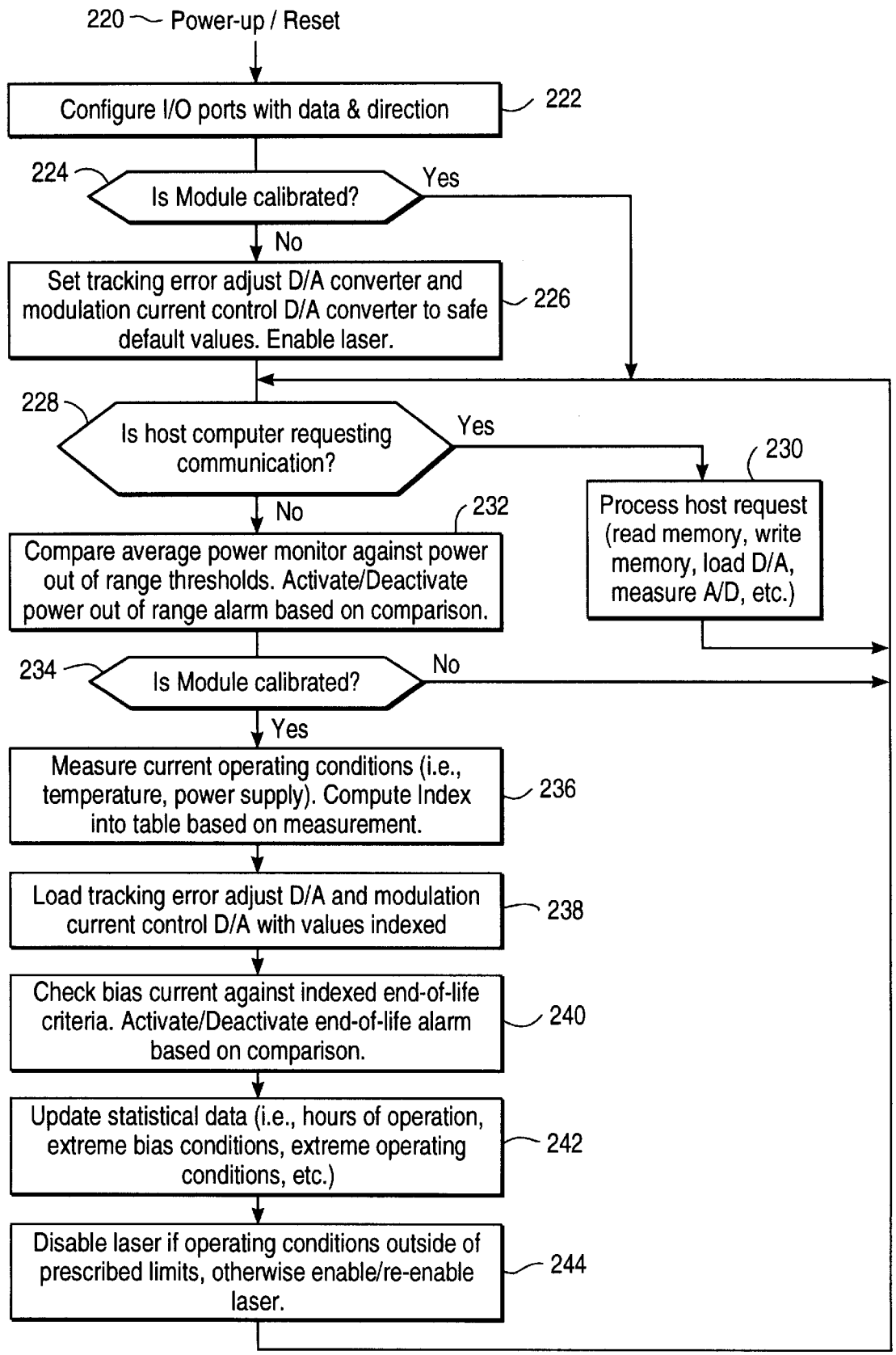
FIG. 14 is a top level flow chart illustrating the execution flow of the operational microcode of the microcontroller that the controls the laser transmitter module.

FIG. 14 illustrates a top level flow of the execution of the microcode (held in non-volatile memory such as EEPROM) in microcontroller 50.

Upon power-up or a reset condition (step 220), microcontroller 50 first configures all I/O ports (of microcontroller 50 or other ports in the system, if any) with appropriate data and direction, and all variables are initialized at step 222. Microcontroller 50 at step 224 interrogates a calibration flag in the non-volatile EEPROM of microcontroller 50 to determine if the module has been calibrated (i.e., whether calibration data has been loaded in the module's EEPROM). If the module has not been calibrated, at step 226 some "safe" default values are loaded in tracking error adjust DAC 44 and modulation current control DAC 24. Laser diode 36 is then enabled. This procedure allows for testing of the functional operation of the module (particularly laser diode 36) before the calibration process is carried out. With this feature, any non-functional modules can be repaired at early stage and before they go through calibration.

Microcontroller 50 at step 228 determines if there is a communication request. If there is a request, microcontroller 50 at step 230 services the request and continues to do so until there is no longer a communication request. A communication request may be serviced in the form of reading memory, writing memory, loading D/A's, reading an A/D channel, executing special commands, etc. If there are no pending requests from a host (such as control and monitor computer 90 or other computing device in the system) to communicate with the module, microcontroller 50 at step 232 compares the output of the average power monitor with predetermined power out-of-range thresholds. The power out-of-range alarm is then activated or deactivated based on the outcome of the comparison. If the module is not calibrated, microcontroller 50 goes back (at step 234) and continuously repeats the previous steps as previously described.

If the module is calibrated, microcontroller 50 enters the scan loop where it makes an iteration of the laser control algorithm. A possible laser control algorithm would proceed as follows: step 236, measure current operating conditions (i.e. temperature and/or power supply), and compute index into table or solve polynomial equations based on operating conditions; step 238, update tracking error adjust DAC 44, and update modulation current control DAC 24; step 240, check the bias current against indexed "end-of-life" criteria, with the alarm activated or deactivated accordingly; step 242, update statistical data such as highest and lowest temperature, extreme bias or operating conditions (such as temperature) and bias observed; and step 244, disable laser diode 36 if conditions fall outside prescribed thresholds, and otherwise enable/re-enable laser.

At this point microcontroller 50 returns to step 228 for purpose of determining if there is a communication request from an external host and repeats the process previously described. There are several variations and sequences on this described flow of code execution that are utilized in other embodiments. What is important to note is, with a microcontroller-based control system in accordance with the present invention, the control flow algorithms and sequences are easily modified for different applications providing a versatile design and manufacturing approach.

Referring again to FIG. 1, serial interface 26 to microcontroller 50 of a laser transmitter module in accordance with preferred embodiments of the present invention provides a convenient interface for communicating with microcontroller 50 during calibration, test and verification procedures. Serial interface 26, however, is used in certain embodiments during operation of laser diode 36 without interruption of service. In such embodiments, laser diode 36 may remain "on-line" during communication with microcontroller 50. Serial interface 26 provides a valuable interface for purposes of allowing a host computer or communication system to interrogate or communicate with microcontroller 50, thereby enabling monitoring and changing operational parameters without interruption of service. In such embodiments, A/D channels of the module may be monitored, D/A channels may be loaded, table entries may be monitored and/or changed, and statistical information may be gathered, such as increased bias/threshold current due to aging.

In one particular aspect of the present invention, user programmability is provided so that users may control or desirably alter control parameters such as power supply or end-of-life alarms. With certain embodiments (such as described below), slope efficiency changes due to aging are monitored, and the user programmability functionality of the present invention enables the host computer or communications network to "schedule" or initiate with microcontroller 50 an appropriate time for slope efficiency calculations or other self-diagnostics. In such embodiments, modules in accordance with the present invention may extend their useful life so that necessary repair and/or replacement may occur at a more optimum time for the operation of the computer or communications network, etc. For security purposes, the microcode in the memory of microcontroller 50 is provided with a password control feature, thereby preventing unauthorized access to the control parameters of the module. In addition, microcontroller 50 in such embodiments may require a specific predetermined signal protocol. As a result, a "dual firewall" is effectively provided with the present invention (i.e., users not knowing both the proper signal protocol and password may be refused access to microcontroller 50).

As was discussed earlier, in applications in which slope efficiency (S) degradation as a function of aging is a significant concern, then alternate embodiments of the present invention are provided. Such alternate preferred embodiments take into account slope efficiency (S) changes due to temperature changes. Such preferred embodiments may also be used to account for changes in slope efficiency (S) due to aging by re-calibrating the laser periodically. Although recent data on several multi-quantum well lasers have indicated little change in slope efficiency due to aging, mechanical shock, thermal shock, high temperature storage, temperature cycling, etc. Despite such suggestions, however, it has been determined that alternative embodiments addressing slope efficiency changes as a function of parameters or variables other than temperature provide additional benefits over prior art controllers.

Figure 15:
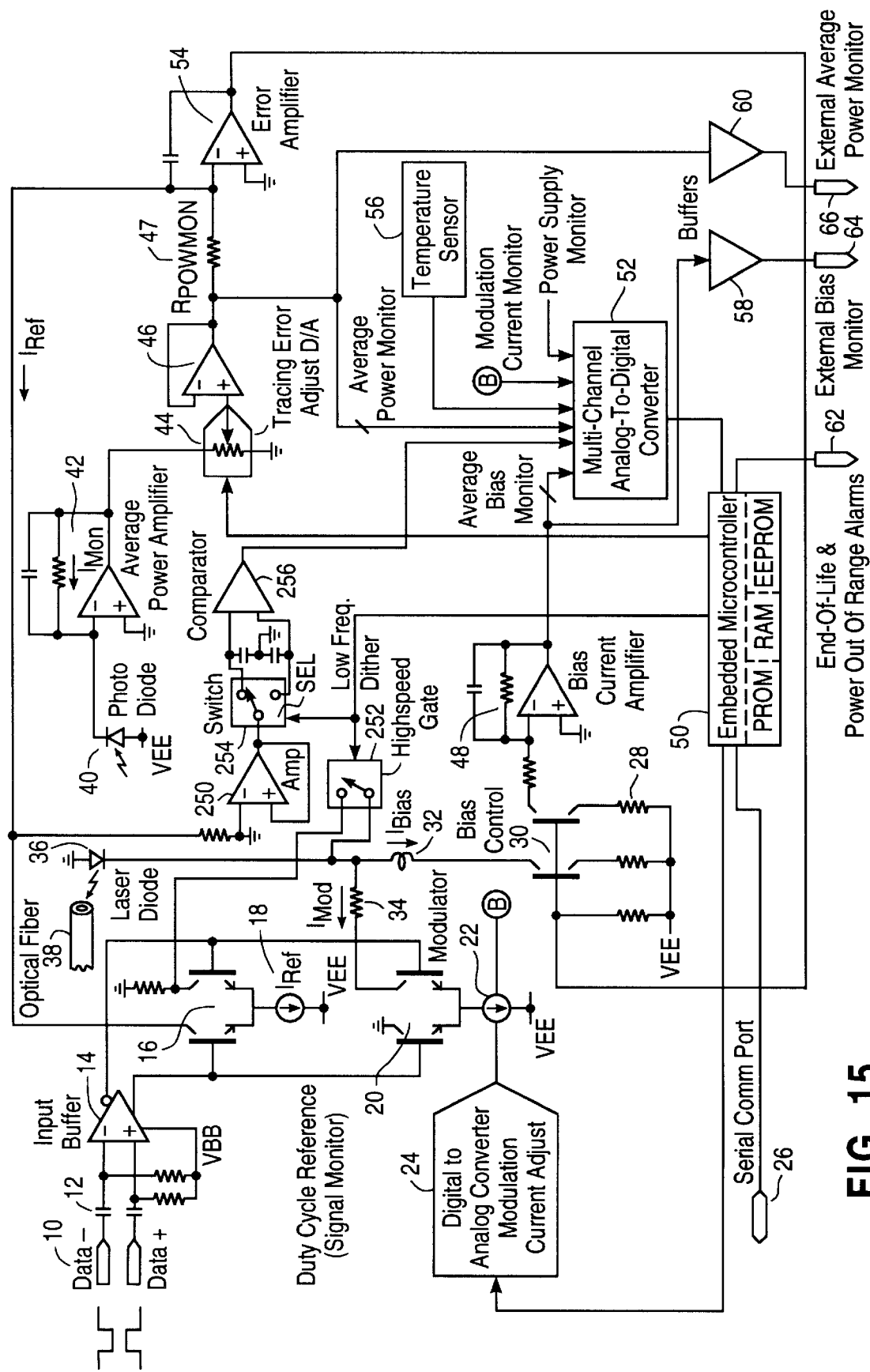
FIG. 15 is a circuit diagram of an alternate embodiment of the laser diode transmitter and associated control circuitry that provides a synchronous slope detector.

FIG. 15 illustrates an embodiment of the present invention that implements a synchronous slope detector in the control function of laser diode 36. A low frequency square wave is provided from microcontroller 50. This low frequency square wave (or dither) is used to control high speed gate 252 and the switch of switched capacitor network 254. High speed gate 252 is used to switch a small amount of excess current through laser diode 36 when data=0 ($P_O$ level) at a periodic rate. For example, assume the low frequency dither signal to be a 500 Hz square wave. For 1 millisecond of the 2 millisecond period, a small amount of excess current is gated through laser diode 36 when data=0; for the other 1 millisecond of the 2 millisecond period, the excess current is not gated through laser diode 36 when data=0. Switched capacitor network 254 is switched synchronously with the excess current gated through laser diode. Comparator 256 is used to compare the detected (via back facet photo diode 40 through buffer amplifier 250) power differential between the two periods of time. If laser diode 36 is biased below threshold, then the difference will be minimal. If laser diode 36 is biased above threshold, then a difference will be observed. This difference observation results from a small increase in current when data=0 causing a significant change in optical output power during the "data=0" time. High speed gate 252 together with switched capacitor network 254 and comparator 256 may be used to determine the bias ($P_O$)/threshold relationship. The output of comparator 256 is monitored by microcontroller 50 via multi-channel analog to digital converter 52.

With such alternate preferred embodiments, the calibration and operational firmware process flows vary slightly. During calibration, the table for modulation current control DAC 24 becomes a default/start-up table. During execution of the operational microcode, microcontroller 50 monitors the output of comparator 256 to determine if laser diode 36 is biased at the desired point with respect to the threshold current. Microcontroller then adjusts modulation DAC 24, causing the automatic power control loop to adjust the bias point accordingly. This process is repeated as part of the continuous scan loop. In this fashion, microcontroller 50 maintains the bias of laser diode 36 at a desired bias/threshold relationship regardless of changes in temperature or slope efficiency (S).

The implementation of high speed gate 252 is important for high speed modulation applications, and in certain embodiments is implemented in the form of a diode gate. Such a diode gate must be able to switch at a rate equal to the highest possible edge rate (for gating excess current through laser diode 36 during data=0 conditions and not during data=1 conditions).

With the use of embodiments such as illustrated in FIG. 15, the slope efficiency may be dynamically determined, which also provides a dynamic or in-the-field method of determining the laser diode threshold current. With such alternative embodiments, as the laser diode ages, slope efficiency and threshold current may be monitored and used in an effort to determine if the operational parameters read from non-volatile memory can be expected to provide suitable operating conditions for the laser diode. Based on such determination, an alarm or suitable message may be provided to a host computing device in the communication network (so that correct action, maintenance, etc., may be performed), or alternatively microcontroller 50 may calculate adjusted operational parameters in an effort to provide optimum operation of the laser diode, etc.

In still other embodiments, microcontroller 50 monitors the voltage level produced by the power supply over a predetermined range, such as +/−5% of the nominal power supply voltage level. In such embodiments, during calibration the power supply is stepped over the desired range, and additional tables and/or indices are produced and stored in non-volatile memory so that microcontroller 50 may select operating parameters based on power supply voltage levels, temperature, etc. Accordingly, with such embodiments power supply variations may be compensated for, in a manner analogous to the temperature characterization/compensation described in detail elsewhere herein.

In yet other embodiments, additional characteristics are measured, stored and utilized to retrieve operational data/parameters from memory. For example, if it is determined that the back facet photo diodes of the laser diodes used for a particular application do not respond linearly with respect to optical output power, during calibration data are collected over a range of optical output power levels, so that the front-to-rear tracking of the laser diode/back facet photo diode may be measured. In such embodiments, the circuit of FIG. 1 is altered, for example, so that the loops are opened and the bias current may be stepped by microcontroller 50 in a controlled manner over a range of laser diode optical output power levels. In such embodiments, for example, such front-to-rear tracking as a function of optical output may be used to perform advanced, in-the-field recalibration of the transmitter module. As an illustrative example, during an off-line conditions, the transmitter module may be configured to step the bias current and measure the optical output power of the laser diode using the stored characteristic data for the back facet photo diode. As a result, the transmitter module may attempt to recalibrate itself in the field, and, under control of microcontroller 50, determine appropriate adjustments for the previously stored parameters and/or generate new parameters, which may be stored in non-volatile memory for access during future operations.

What is important to note is that the various embodiments of the present invention provide intelligent, programmable, adaptable transmitter modules, and methods of operating and manufacturing the same, that may be used over a range of operating conditions.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A fiberoptic transmitter, comprising:

a laser diode emitting optical energy; and a biasing circuit for applying bias to the laser diode, wherein the bias circuit comprises at least first and second control loops wherein the first control loop, under processor control, supplies an amount of modulation current to the laser diode responsive to the data retrieved by the processor from a memory, wherein the retrieved data is dependent upon one or more currently sensed operating conditions of the laser diode, and wherein the second control loop provides bias current to the laser diode in an amount to maintain the optic energy emitted from the laser diode at a predetermined average level.

2. The transmitter of claim 1, wherein:

the transmitter is used to transmit digital data; and the amount of bias current provided by the second control loop to the laser diode is independent of duty cycle changes in the transmitted data.

3. The transmitter of claim 1, wherein:

the laser diode, when located in an environment in which the currently sensed operating conditions prevail, is characterized by an L-I curve having a threshold current; and the bias current provided to the laser diode and the threshold current are in a fixed relationship that is independent of the currently sensed operating conditions.

4. The transmitter of claim 3, wherein the bias current provided to the laser diode is equal to or slightly greater than the threshold current regardless of the currently sensed operating conditions.

5. The transmitter of claim 1, wherein:

the transmitter further comprises a power supply providing a power supply voltage; and one of the one or more operating conditions is the power supply voltage.

6. The transmitter of claim 1, wherein one of the one or more operating conditions is a currently sensed temperature.

7. The transmitter of claim 6, wherein:

the second control loop comprises a photodiode that produces a current in response to the optical energy emitted by the laser diode; and the processor control supplies to the second control loop a signal that is indicative of the ratio of the current produced by the photodiode to the optical energy emitted by the laser diode, the signal being responsive to data retrieved by the processor from the memory, wherein the retrieved data is responsive to the currently sensed temperature.

8. The transmitter of claim 6, further comprising:

a circuit for determining the magnitude of the bias current provided to the laser diode and for providing a signal to the processor control indicating the magnitude; and an end-of-life alarm that is set off by the processor control when a comparison performed by the processor control indicates that the magnitude is greater than a value retrieved from the memory, wherein the value is dependent upon the currently sensed temperature.

9. The transmitter of claim 6, wherein:

the memory stores, for each particular temperature in a set of temperatures, data from which the processor control can determine an appropriate modulation current to supply to the laser diode when the currently sensed temperature is the particular temperature.

10. The transmitter of claim 6, wherein:

the memory stores parameters of a function of temperature; and the processor control determines an appropriate modulation current to supply to the laser diode when the currently sensed temperature is a particular temperature by evaluating the function at the particular temperature.

11. A method of calibrating a fiberoptic transmitter, the transmitter including a laser diode emitting optical energy and a biasing circuit for applying bias to the laser diode, the bias circuit including first and second control loops, the first control loop, under processor control, supplying during normal operation of the transmitter an amount of modulation current to the laser diode responsive to data retrieved by the processor froma a memory, the retrieved data having been stored in the memory during a previous calibration of the transmitter and depending upon a currently sensed operating condition of the laser diode, the second control loop providing bias current to the laser diode in an amount to maintain the optic energy emitted from the laser diode at a predetermined average level, the method comprising, for each particular value in a set of values for the operating condition, the steps of:

placing the transmitter in an environment where the operating condition has the particular value;

for each particular modulation current from a series of increasing modulation currents, supplying the particular modulation current to the laser diode, and measuring a corresponding value of an optical parameter of the laser diode;

using the series of modulation currents and their respective corresponding values of the optical parameter to obtain a plot of the optical parameter against modulation current, the plot including first and second segments, the optical parameter varying significantly with modulation current in the first segment, the optical parameter not varying significantly with modulation current in the second segment; and determining a modulation current associated with a point at which the first and second segments are joined and storing the associated modulation current in a first location of memory associated with the particular value of the operating condition.

12. The method of claim 11, further comprising the step of:

supplying to the laser diode the modulation current associated with the point at which the first and second segments are joined and measuring the corresponding bias current provided to the laser diode by the second control loop.

13. The method of claim 12, further comprising the steps of:

calculating an end-of-life bias current from the measured corresponding bias current; and storing the end-of-life bias current in a second location of memory associated with the particular value of the operating condition.

14. The method of claim 11 wherein the operating condition is temperature.

15. The method of claim 11, wherein the optical parameter is the amount of optical energy emitted by the laser diode when the bias current but not the modulation current is provided to the laser diode.

16. The method of claim 11, wherein the optical parameter is the ratio of the amount of optical energy emitted by the laser diode when the bias current and the modulation current are provided to the laser diode over the amount of optical energy emitted by the laser diode when the bias current but not the modulation current is provided to the laser diode.

\* \* \* \* \*